(12) United States Patent
Son et al.

(10) Patent No.: US 10,103,165 B2
(45) Date of Patent: Oct. 16, 2018

(54) MEMORY DEVICE

(71) Applicant: SAMSUNG ELECTRONICS CO., LTD., Suwon-si, Gyeonggi-do (KR)

(72) Inventors: Young Hwan Son, Hwaseong-si (KR); Won Chul Jang, Yongin-si (KR); Dong Seog Eun, Seongnam-si (KR); Jae Hoon Jang, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/481,609

(22) Filed: Apr. 7, 2017

(65) Prior Publication Data
US 2018/0019257 A1    Jan. 18, 2018

(30) Foreign Application Priority Data
Jul. 14, 2016    (KR) .................. 10-2016-0089271

(51) Int. Cl.
| | | |
|---|---|---|
| *H01L 27/11568* | (2017.01) | |
| *H01L 27/11578* | (2017.01) | |
| *H01L 27/11582* | (2017.01) | |
| *H01L 27/11556* | (2017.01) | |
| *H01L 23/528* | (2006.01) | |
| *H01L 27/11519* | (2017.01) | |
| *H01L 27/11565* | (2017.01) | |

(52) U.S. Cl.
CPC .... *H01L 27/11582* (2013.01); *H01L 23/5283* (2013.01); *H01L 27/11519* (2013.01); *H01L 27/11556* (2013.01); *H01L 27/11565* (2013.01); *H01L 27/11568* (2013.01); *H01L 27/11578* (2013.01)

(58) Field of Classification Search
CPC ......... H01L 27/11582; H01L 27/11556; H01L 27/11519; H01L 27/11565; H01L 27/11551; H01L 27/1157; H01L 27/11568
See application file for complete search history.

(56) References Cited

U.S. PATENT DOCUMENTS

| | | | |
|---|---|---|---|
| 8,461,003 B2 | 6/2013 | Joo et al. | |
| 8,957,495 B2 | 2/2015 | Sakui | |
| 9,117,923 B2* | 8/2015 | Shim ................. | H01L 27/11556 |
| 9,153,705 B2 | 10/2015 | Zhang et al. | |
| 9,236,340 B2 | 1/2016 | Lee et al. | |
| 2010/0226195 A1 | 9/2010 | Lue | |

(Continued)

FOREIGN PATENT DOCUMENTS

| | | |
|---|---|---|
| JP | 2015-79862 A | 4/2015 |
| KR | 10-2013-0044706 A | 5/2013 |
| KR | 10-2013-0076458 A | 7/2013 |

*Primary Examiner* — Galina Yushina
(74) *Attorney, Agent, or Firm* — Lee & Morse P.C.

(57) ABSTRACT

A memory device includes a gate structure including a plurality of gate electrode layers stacked on an upper surface of a substrate, a plurality of vertical holes extending in a direction perpendicular to the upper surface of the substrate to penetrate through the gate structure, and a plurality of vertical structures in the plurality of vertical holes, respectively, each vertical structure of the plurality of vertical structures including an embedded insulating layer, and a plurality of channel layers separated from each other, the plurality of channel layers being outside the embedded insulating layer.

20 Claims, 27 Drawing Sheets

(56) References Cited

U.S. PATENT DOCUMENTS

| | | | |
|---|---|---|---|
| 2013/0207225 A1* | 8/2013 | Sakui | H01L 29/7889 |
| | | | 257/499 |
| 2015/0109862 A1 | 4/2015 | Shibata et al. | |
| 2016/0071876 A1 | 3/2016 | Mizuno et al. | |
| 2017/0040061 A1* | 2/2017 | Yeh | G11C 16/14 |
| 2017/0194340 A1* | 7/2017 | Lue | H01L 27/11556 |

* cited by examiner

MEMORY DEVICE

CROSS-REFERENCE TO RELATED APPLICATION

Korean Patent Application No. 10-2016-0089271, filed on Jul. 14, 2016, in the Korean Intellectual Property Office, and entitled: "Memory Device," is incorporated by reference herein in its entirety.

BACKGROUND

1. Field

The present disclosure relates to a memory device.

2. Description of the Related Art

Volumes of electronic products have gradually been reduced, while still being required to process high capacity data. Thus, the integration of semiconductor memory devices used in such electronic products needs to be increased. As a method in which the integration of semiconductor memory devices may be increased, a memory device having a vertical transistor structure, rather than an existing planar transistor structure, has been proposed.

SUMMARY

According to an aspect of embodiments, a memory device includes a gate structure including a plurality of gate electrode layers stacked on an upper surface of a substrate, a plurality of vertical holes extending in a direction perpendicular to the upper surface of the substrate to penetrate through the gate structure, and a plurality of vertical structures including an embedded insulating layer provided in each of the plurality of vertical holes and a plurality of channel layers separated from each other while being disposed outside the embedded insulating layer in one of the plurality of vertical holes.

According to another aspect of embodiments, a memory device includes a gate structure including a plurality of gate electrode layers stacked on an upper surface of a substrate, an interlayer insulating layer disposed on an upper surface of the gate structure, a plurality of vertical structures penetrating through the interlayer insulating layer and the gate structure and including an embedded insulating layer and a plurality of channel layers disposed outside the embedded insulating layer, a plurality of studs directly connected to the plurality of channel layers provided in one of the plurality of vertical structures, respectively, and a plurality of bit lines connected to at least one of the plurality of studs.

According to yet another aspect of embodiments, a memory device includes a gate structure including a plurality of gate electrode layers stacked on an upper surface of a substrate, a plurality of vertical holes extending in a direction perpendicular to the upper surface of the substrate to penetrate through the gate structure, and a plurality of vertical structures in the plurality of vertical holes, respectively, each vertical structure of the plurality of vertical structures including a plurality of channel layers separated from each other by an embedded insulating layer within a same vertical hole.

BRIEF DESCRIPTION OF DRAWINGS

Features will become apparent to those of ordinary skill in the art by describing in detail exemplary embodiments with reference to the attached drawings, in which.

DETAILED DESCRIPTION

Hereinafter, embodiments will be described with reference to the accompanying drawings.

Figure 1:
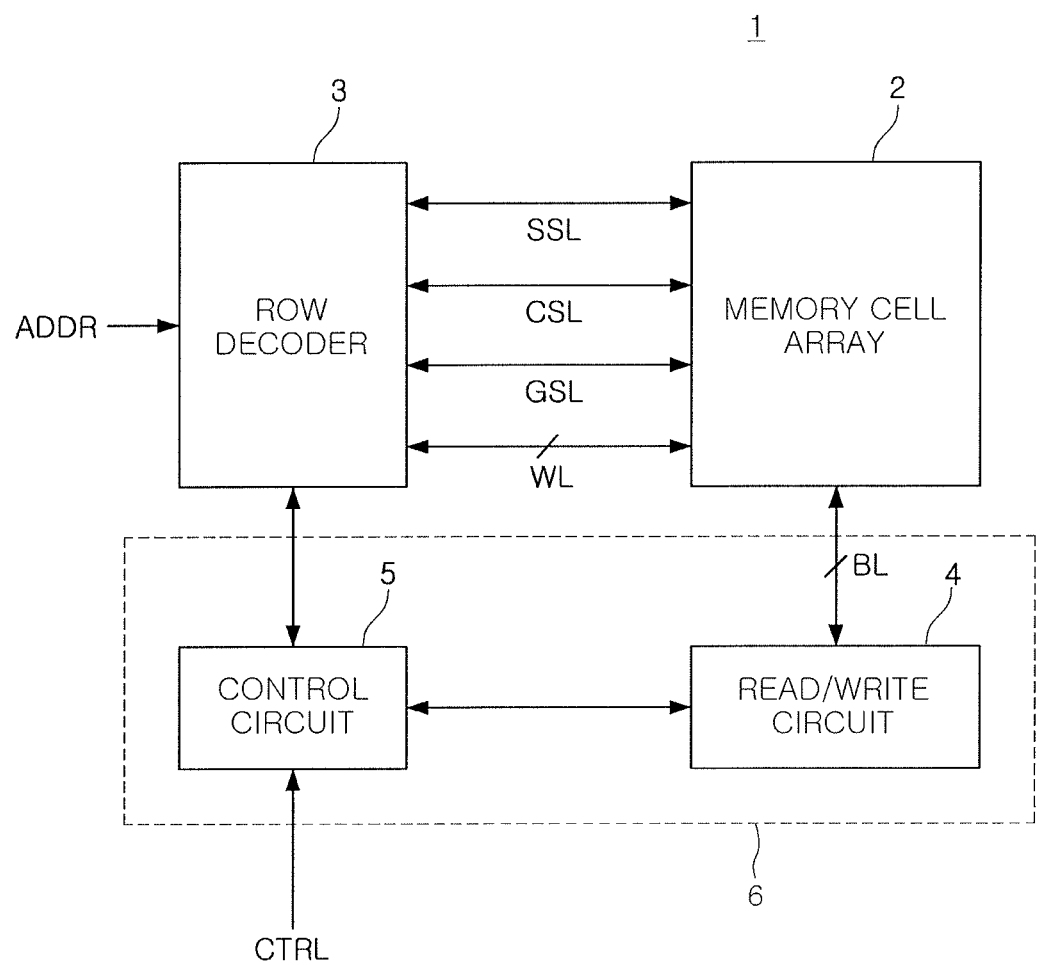
FIG. 1 illustrates a schematic block diagram of a memory device according to an example embodiment.

FIG. 1 is a schematic block diagram of a memory device according to an example embodiment.

With reference to FIG. 1, a memory device 1 according to an example embodiment may include a memory cell array 2, a row decoder 3, and a core logic circuit 6. The core logic circuit 6 may include a read/write circuit 4 and a control circuit 5.

The memory cell array 2 may include a plurality of memory cells arranged in a plurality of rows and a plurality of columns. The plurality of memory cells included in the memory cell array 2 may be connected to the row decoder 3 through a word line WL, a common source line CSL, a string select line SSL, a ground select line GSL, and the like, and may be connected to the read/write circuit 4 through a bit line BL. In an example embodiment, a plurality of memory cells arranged linearly in a single row may be connected to a single word line WL, and a plurality of memory cells arranged linearly in a single column may be connected to a single bit line BL.

The plurality of memory cells included in the memory cell array 2 may be divided into a plurality of memory blocks. A respective memory block may include a plurality of word lines WL, a plurality of string select lines SSL, a plurality of ground select lines GSL, a plurality of bit lines BL, and at least one common source line CSL.

The row decoder 3 may receive externally provided address information ADDR, and may decode the received address information ADDR to determine a signal supplied to at least a portion of the word line WL, the common source line CSL, the string select line SSL, and the ground select line GSL connected to the memory cell array 2.

The read/write circuit 4 may select at least a portion of bit lines BL connected to the memory cell array 2 in response to a command provided from the control circuit 5. The read/write circuit 4 may read data written to a memory cell connected to the selected at least a portion of bit lines BL, or may write data to a memory cell connected to the selected at least a portion of bit lines BL. In order to perform operations as described above, the read/write circuit 4 may include a circuit such as a page buffer, an input/output buffer, a data latch, and the like.

The control circuit 5 may control operations of the row decoder 3 and the read/write circuit 4 in response to a control signal CTRL transferred externally. In the case of reading data written to the memory cell array 2, the control circuit 5 may control operations of the row decoder 3 to supply a voltage to a memory cell in which the data to be read is stored for a reading operation, through the word line WL. When the voltage for a reading operation is supplied through a specific word line WL, the control circuit 5 may perform controlling so that the read/write circuit 4 may read data written to a memory cell connected to the word line WL having received the voltage for a reading operation.

In a different manner, for example, when data is written to the memory cell array 2, the control circuit 5 may control operations of the row decoder 3 to supply a voltage for a writing operation to the memory cell to which the data is to be written, through a word line WL. When the voltage for a writing operation is supplied through a specific word line WL, the control circuit 5 may control the read/write circuit 4 to write data to a memory cell connected to the word line WL to which the voltage for a writing operation has been supplied.

Figure 2:
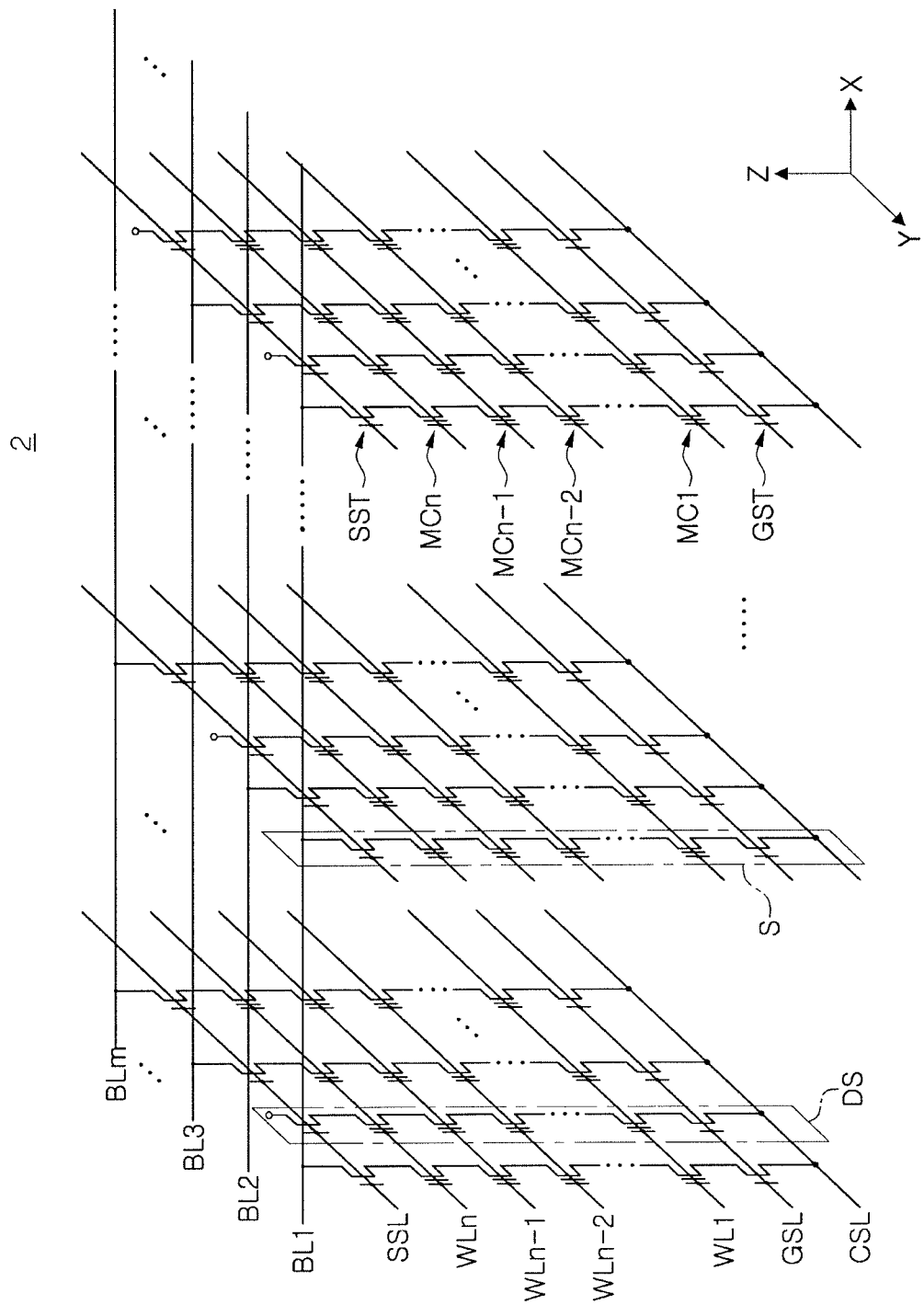
FIG. 2 illustrates an equivalent circuit diagram of a memory cell array of a memory device according to an example embodiment.

FIG. 2 is an equivalent circuit diagram of the memory cell array 2 of the memory device 1. A semiconductor device according to an example embodiment may be a vertical NAND flash device.

Referring to FIG. 2, the memory cell array 2 may include a plurality of memory cell strings S. For example, each memory cell string S may include n number of memory cells MC1 to MCn connected to one another in series, and a ground select transistor GST and a string select transistor SST respectively connected to two opposite ends of the memory cell string S, e.g., to MC1 and to MCn respectively. The memory cell strings S connected to one another in series may be connected to n number of word lines WL1 to WLn to select the memory cells MC1 to MCn, respectively. A dummy cell may be further disposed between the ground select transistor GST and a first memory cell MC1 and between the string select transistor SST and an nth memory cell MCn.

Gate terminals of the ground selection transistors GST may be connected to a ground select line GSL, and source terminals thereof may be connected to a common source line CSL. Gate terminals of the string select transistors SST may be connected to a string select line SSL, and source terminals thereof may be connected to drain terminals of memory cells MCn. Although FIG. 2 illustrates a structure in which one ground selection transistor GST and one string select transistor SST are respectively connected to the n number of memory cells MC1 to MCn connected to one another in series, in a manner different therefrom, a plurality of ground selection transistors GST or a plurality of string select transistors SST may also be connected thereto.

Drain terminals of the string select transistors SST may be connected to a plurality of bit lines BL1 to BLm. When a signal is applied to gate terminals of the string select transistors SST through the string select line SSL, the signal applied through the bit lines BL1 to BLm may be transferred to the n number of memory cells MC1 to MCn connected to one another in series, and thus, a data reading operation or a data writing operation may be performed. In addition, as a predetermined level of erase voltage is applied thereto through a well region formed in a substrate, an erase operation in which data having been written to the memory cells MC1 to MCn is removed may be performed.

On the other hand, with reference to FIG. 2, the memory device according to an example embodiment may include at least one dummy string DS. The dummy string DS may be a string including a dummy channel electrically isolated from the bit lines BL1 to BLm.

Figure 3A:
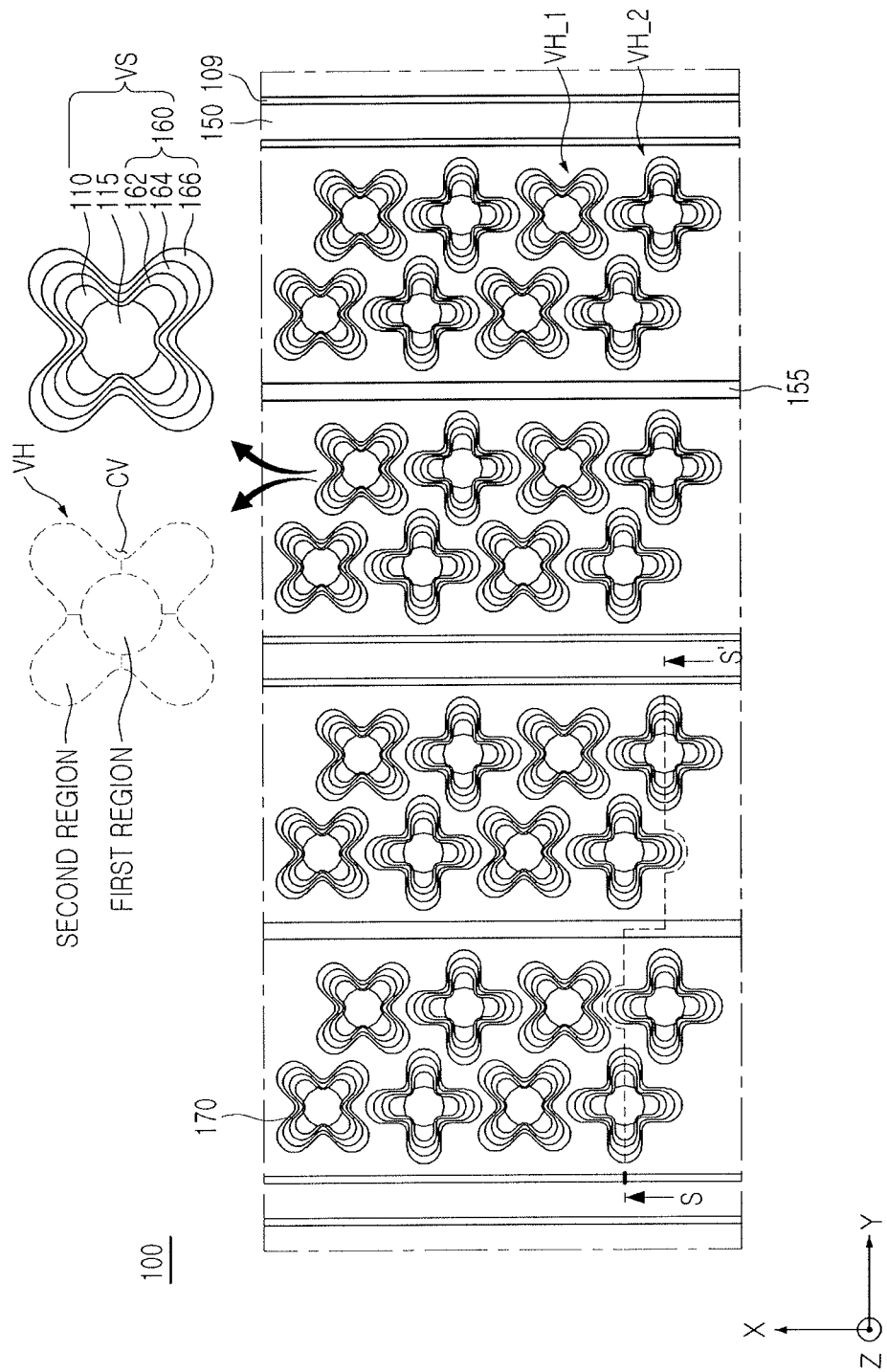
FIG. 3A illustrates a plan view of a portion of a memory device according to an example embodiment.

FIG. 3A is a plan view illustrating a portion of a memory device 100 according to an example embodiment. It is noted that the memory device 100 is substantially the same as the memory device 1 described previously with reference to FIGS. 1-2.

With reference to FIG. 3A, the memory device 100 may include a plurality of vertical structures VS provided in a plurality of vertical holes VH, respectively, a common source line 150, an isolation insulating layer 155, and the like. The memory device 100 may include a gate structure in which a plurality of gate electrode layers and a plurality of insulating layers are alternately stacked in a Z-axis direction, and the plurality of vertical holes VII may extend in the Z axis direction while penetrating through the gate structure to thus form a predetermined space. The plurality of vertical structures VS may be provided in the spaces formed by the plurality of vertical holes VII.

The gate structure may be divided into a plurality of regions by side spacers 109 disposed on sides of the common source line 150. The side spacer 109 may prevent the common source line 150 from directly contacting the gate structure and may include an insulating material, e.g., silicon oxide and the like.

Each of the plurality of vertical holes VH may include a first region corresponding to a central region thereof and a plurality of second regions respectively extended from the first region in a plurality of different directions. The first region may have a substantially circular shape, and the plurality of second regions may have respective convex shapes extended and protruding from an outer side of the first region. For example, as illustrated in FIG. 3A, the second regions may extend radially from the first region, and may be adjacent to each other along a circumference of the first region. In an example embodiment, the plurality of second regions may have respective semielliptical shapes and an end portion of the second region, e.g., a portion of each second region that faces away from the first region, may have a curved shape.

A concave portion CV having an indented shape, e.g., indented from an outer side of the vertical hole VH, may be defined between the plurality of second regions respectively protruding in a plurality of directions. In the case of the vertical hole VH, a concave-shaped portion and a convex shaped portion thereof may be alternately disposed along a circumference of the first region having a circular shape.

The plurality of second regions formed in a single vertical hole VH may be disposed symmetrically to each other, with respect to the first region. With reference to FIG. 3A, since four second regions are provided, a first pair of second regions may be symmetrical to each other with respect to the first region, and a second pair of second regions may also be symmetrical to each other with respect to the first region. In this case, the first pair of second regions and the second pair of second regions may intersect each other, with respect to the first region.

In addition, the plurality of second regions formed in a single vertical hole VH may extend in a plurality of directions, with respect to the first region, to uniformly divide an X-Y plane on which the first region is provided. The plurality of second regions in a single vertical hole VH may be provided as at least three second regions. For example, in an assumption that the plurality of second regions are N number of second regions, where N is an integer that equals 3 or more, N second regions may extend in N different directions to uniformly divide the X-Y plane. In this case, when one second region is rotated by 360/N in a direction in which it extends, with respect to the first region, the one second region may substantially overlap another second region.

Referring to the example embodiment illustrated in FIG. 3A, four second regions may be provided in a single vertical hole VH. The four second regions may extend in four different directions, with respect to a first region, to thus uniformly divide an X-Y plane.

A plurality of vertical holes VH may be disposed to be separated from each other on the X-Y plane, and may be disposed in a zigzag manner in at least one direction. In addition, the plurality of vertical holes VH may be disposed to be uniformly separated from each other in a matrix form. The plurality of vertical holes VH may be repetitively disposed by being shifted by a predetermined distance, based on the isolation insulating layer 155. The plurality of vertical holes VH may be disposed to be symmetrical to each other, with the isolating insulating layer 155 interposed therebetween.

At least a portion of the plurality of vertical holes VH may include a plurality of second regions protruding in different directions. In detail, a plurality of directions of second regions in a single vertical hole VH may be different from a plurality of directions of second regions in another vertical hole VH. For example, a plurality of second regions provided in a single vertical hole VH may correspond to regions provided by rotating a plurality of second regions provided in another vertical hole VH, with respect to a first region, by a reference angle. In this case, the single vertical hole VH and the another vertical hole VH may be disposed adjacently to each other.

For example, with reference to FIG. 3A, a plurality of second regions provided in any single vertical hole VH_1 among the plurality of vertical holes VII, may be regions provided by rotating a plurality of second regions provided in another vertical hole VH_2, with respect to a first region, by 45 degrees. That is, as illustrated in FIG. 3A, two vertical holes VH adjacent to each other along the X direction may have second regions that are offset with respect to each other by 45 degrees.

According to an example embodiment, directions in which a plurality of second regions in vertical holes VII disposed to be adjacent to each other, among the plurality of vertical holes VH, protrude may be different, to improve spatial efficiency and thus improved the integration of memory cells. In other words, directions of second regions in a first vertical hole VH may be different than directions of second regions in a second vertical hole VH, adjacent to the first vertical hole VH, to increase a number of vertical holes VH in a predetermined area, thereby improving integration of memory cells.

A plurality of vertical structures VS may be provided in the plurality of respective vertical holes VH. Each of the plurality of vertical structures VS may include an embedded insulating layer 115, a plurality of channel layers 110 disposed outside the embedded insulating layer 115, and a gate insulating layer 160 disposed outside the plurality of channel layers 110. The gate insulating layer 160 may include a tunneling layer 162, a charge storage layer 164, and a blocking layer 166 sequentially disposed on the plurality of channel layer 110. However, the number and configuration of layers included in the gate insulating layer 160 are not limited thereto.

In an example embodiment, the embedded insulating layer 115 may be provided in the first region corresponding to a central region of the vertical hole VH. In the plurality of second regions, the channel layer 110 and the gate insulating layer 160 may be sequentially provided from the first region. In detail, the channel layer 110, the tunneling layer 162, the charge storage layer 164, and the blocking layer 166 may be provided in the second regions.

The embedded insulating layer 115 provided in the first region, and the channel layer 110, the tunneling layer 162, the charge storage layer 164, and the blocking layer 166 provided in the second regions may have substantially the same shapes as the first region and the second regions, respectively. For example, in the X-Y plane, the embedded insulating layer 115 provided in the first region may have a circular shape, e.g., to completely fill the first region of the vertical hole VH. For example, in the X-Y plane, the channel layer 110, the tunneling layer 162, the charge storage layer 164, and the blocking layer 166 provided in the second regions may respectively have convex shapes protruding in a plurality of directions.

In detail, the channel layer 110 may be provided as a plurality of channel layers 110 separated from each other, by a concave portion defined as a region between the plurality of second regions, and provided in a single vertical hole VH. For example, as illustrated in FIG. 3A, each channel layer 110 may be in a corresponding second region of a same vertical hole VH, such that each channel layer 110 may, e.g., directly, contact a portion of the embedded insulating layer 115 to extend from the embedded insulating layer 115 toward the rounded end of the second region.

In addition, at least a portion of a plurality of layers included in the gate insulating layer 160 may be divided into a plurality of regions on the concave portion. In an example, the charge storage layer 164 may be divided into and provided as a plurality of regions, e.g., in corresponding second regions of a same vertical hole VH. For example, as illustrated in FIG. 3A, each of the tunneling layer 162, the charge storage layer 164, and the blocking layer 166 may be, e.g., sequentially arranged, in a corresponding second region of a same vertical hole VH to extend from the channel layer 110 toward the rounded end of the second region.

In the case of the memory device 100 according to an example embodiment, a plurality of the channel layers 110 may be provided in a single vertical hole VH, such that a plurality of memory cells may be formed in a single vertical hole VH. Thus, manufacturing efficiency per unit area may be increased as compared to manufacturing of a plurality of memory cells using a plurality of vertical holes. In addition, since a pitch of a vertical hole VH may be significantly increased via improved area efficiency, the difficulty in a manufacturing process may be lowered and a manufacturing yield may be improved.

Figure 3B:
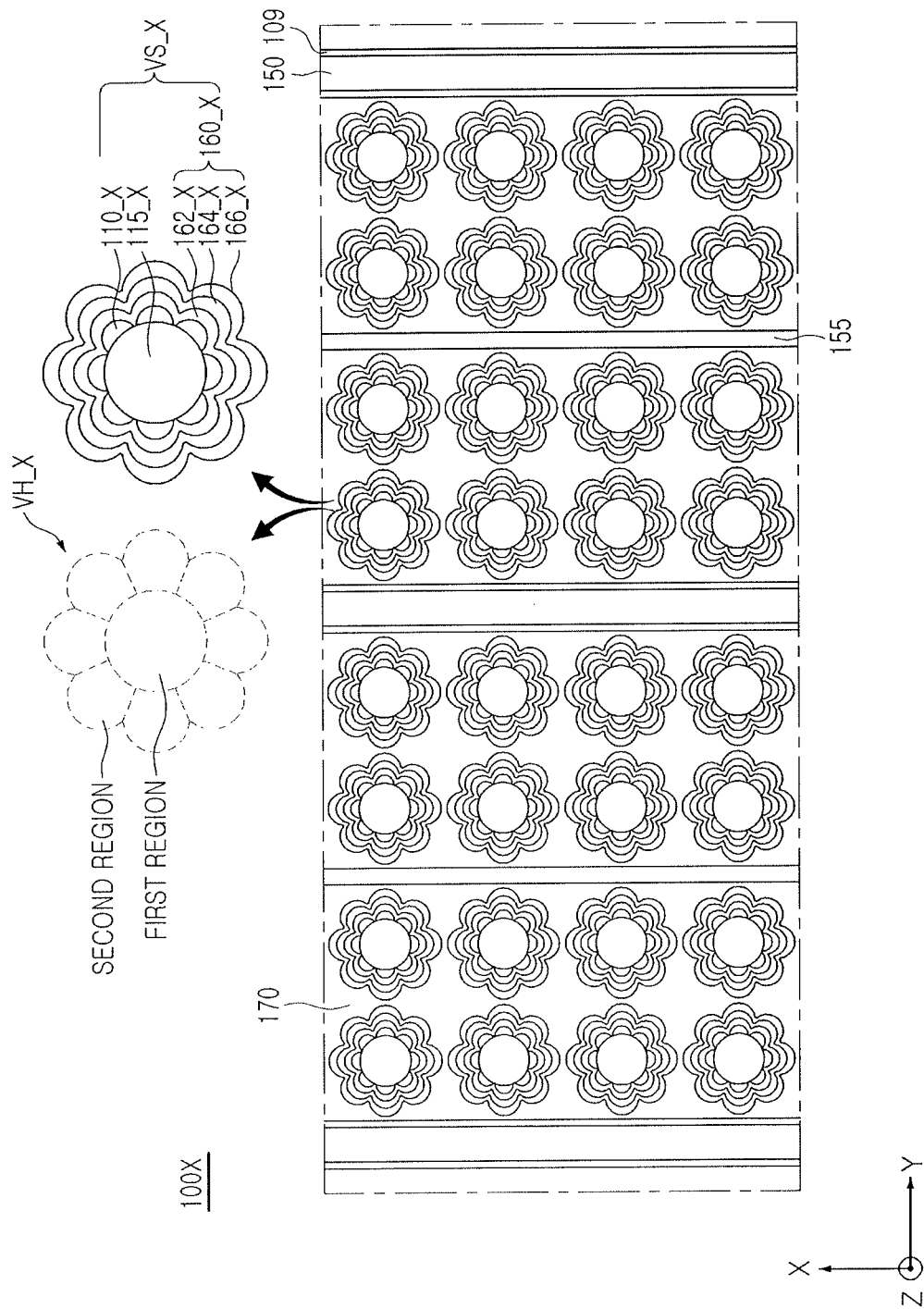
FIG. 3B illustrates a plan view of a portion of a memory device according to an example embodiment.

FIG. 3B is a plan view illustrating a portion of a memory device 100X according to an example embodiment. Since the memory device 100X according to an example embodiment of FIG. 3B has a configuration similar to that of the memory device 100 according to the example embodiment of FIG. 3A, the same description thereas or a description overlapping therewith will be omitted and will be principally described with respect to differences therebetween.

With reference to FIG. 3B, a plurality of second regions formed in a single vertical hole VH_X may be disposed symmetrically to each other, with respect to a first region.

With reference to FIG. 3B, since eight second regions are provided, four pairs of second regions may be symmetrical to each other with respect to the first region. In addition, four second regions may be provided in a single vertical hole VH_X, and the four second regions may extend in eight different directions, with respect to the first region, to thus uniformly divide an X-Y plane. A plurality of channel layers 110_X separated from each other may be disposed in the eight second regions, respectively. In other words, as illustrated in FIG. 3B, each of the vertical holes VH_X may include the first region in the center of the vertical hole VH_X with a plurality of second regions surrounding the first region, e.g., the number and shape of the second regions in FIG. 3B may be different than those of the second regions in FIG. 3A.

As further illustrated in FIG. 3B, a vertical structure VS_X may be formed in each of the vertical holes VH_X. The vertical structure VS_X may include an embedded insulating layer 115_X in the first region, and sequentially stacked channel layers 110_X and gate insulating layer 160_X, i.e., stacked tunneling layers 162_X, charge storage layers 164_X, and blocking layers 166_X, in corresponding second regions.

In an example embodiment, as compared to the memory device of FIG. 3A, the memory device of FIG. 3B includes a larger number of second regions in each of the vertical holes VH_X. Therefore, since a relatively large number of channel layers 110_X are provided in a single vertical hole VH_X, the integration of the memory cell 100X may be further improved.

Figure 3C:
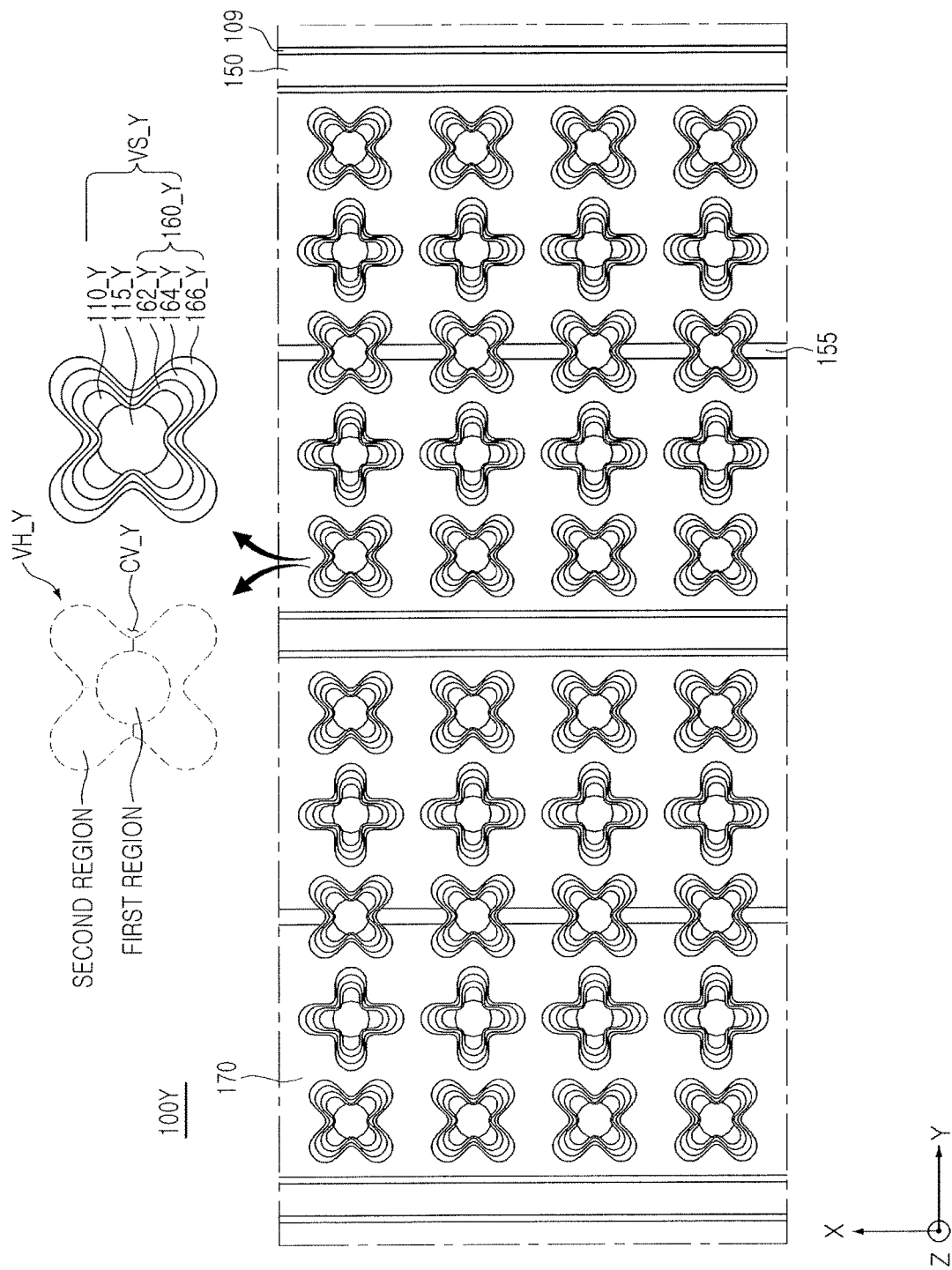
FIG. 3C illustrates a plan view of a portion of a memory device according to an example embodiment.

FIG. 3C is a plan view illustrating a portion of a memory device 100Y according to an example embodiment. Since the memory device 100Y according to an example embodiment of FIG. 3C has a configuration similar to that of the memory device 100 according to the example embodiment of FIG. 3A, the same description thereas or a description overlapping therewith will be omitted and will be principally described with respect to differences therebetween.

With reference to FIG. 3C, a portion, e.g., some, of a plurality of vertical holes VH_Y may penetrate through an isolation insulating layer 155. Among the vertical holes VH_Y, in a vertical hole VH_Y penetrating through the isolation insulating layer 155, a vertical structure VS_Y including an embedded insulating layer 115_Y, a plurality of channel layers 110_Y, and a gate insulating layer 160_Y may be provided. The gate insulating layer 160_Y may include a tunneling layer 162_Y, a charge storage layer 164_Y, and a blocking layer 166_Y.

A region of the vertical hole VH_Y penetrating through the isolation insulating layer 155 may correspond to a first region of the vertical hole VH_Y, in which the embedded insulating layer 115_Y is formed. In this case, since the plurality of channel layers 110_Y of the vertical structure VS_Y formed in the vertical hole VH_Y penetrating through the isolation insulating layer 155, which is a portion of the vertical holes VH_Y, are unaffected by the isolation insulating layer 155, the vertical structure VS_Y provided in the vertical hole VH_Y penetrating through the isolation insulating layer 155, a portion of the vertical holes VH_Y, does not correspond to a dummy vertical structure. Thus, writing operations and the like may also be performed in a memory cell provided by the vertical structure VS_Y penetrating through the isolation insulating layer 155.

Although FIGS. 3A to 3C illustrate the plan views of the memory devices according to various example embodiments, exemplary embodiments are not limited to the illustrations of the drawings and may be modified variously.

Hereinafter, for convenience of explanation, a memory device according to an example embodiment will be principally described with respect to the example embodiment illustrated in FIG. 3A.

Figure 4:
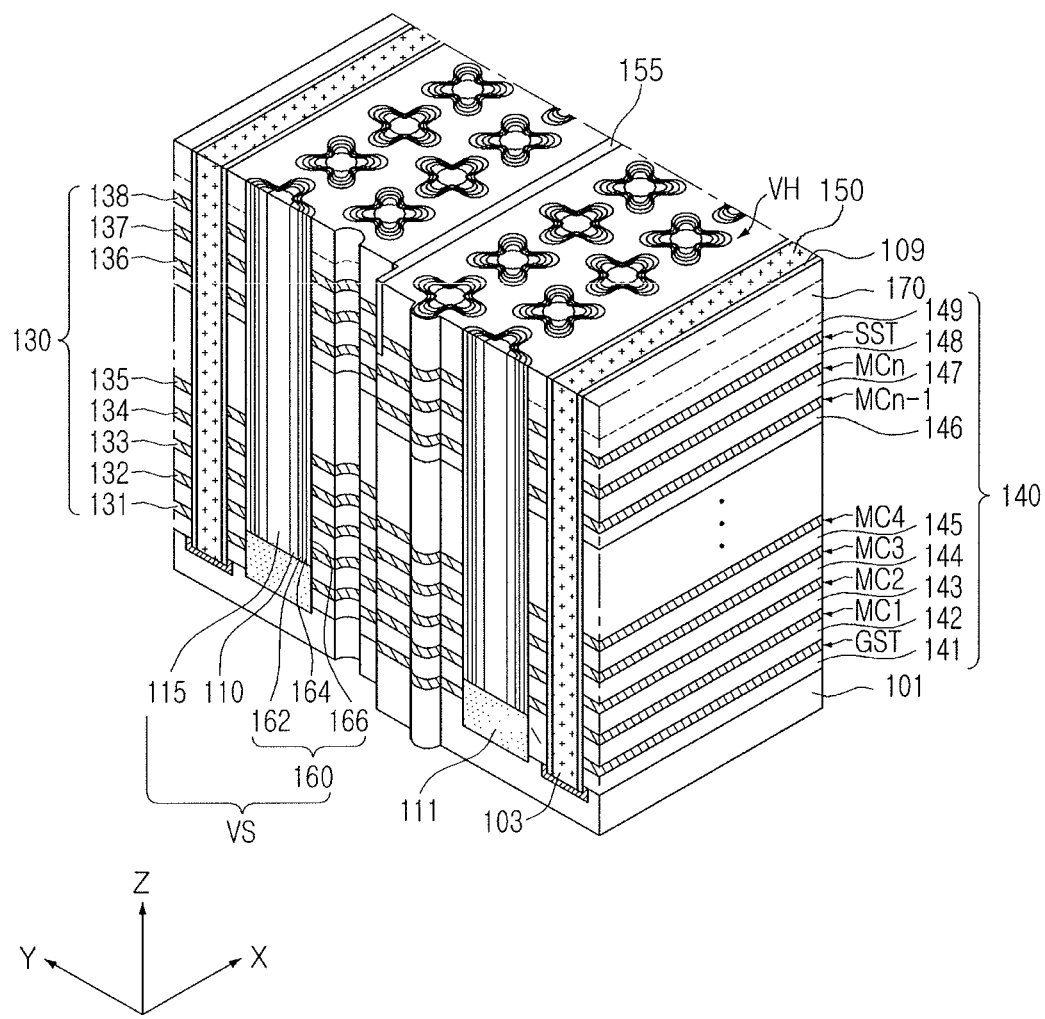
FIG. 4 illustrates a perspective view of a memory device along line S-S' of FIG. 3A.

FIG. 4 is an exploded perspective view of a memory device along line S-S' of FIG. 3A.

With reference to FIG. 4, the memory device 100 according to an example embodiment may include a substrate 101, a plurality of vertical holes VH extended in a direction perpendicular to an upper surface, an X-Y plane in an example embodiment of FIG. 4, of the substrate 101, a plurality of vertical structures VS provided in the plurality of vertical holes VH, respectively, a plurality of gate electrode layers 131 to 138 (gate electrode layers 130) stacked on the substrate 101 to be adjacent to the vertical structures VS, and the like. The plurality of gate electrode layers 130 may be stacked alternately with a plurality of insulating layers 141 to 149 (insulating layers 140) on each other, to thus provide a gate structure. At least a portion of the gate electrode layers, e.g., a gate electrode layer 138, may be divided into a plurality of regions by the isolation insulating layer 155.

The plurality of vertical holes VH may extend in a direction perpendicular to the upper surface of the substrate 101, e.g., along the Z-axis in FIG. 4, and the plurality of vertical structures VS may be provided in the plurality of vertical holes VH, respectively. Each of the plurality of vertical structures VS may include the embedded insulating layer 115, the plurality of channel layers 110 disposed outside the embedded insulating layer 115 and separated from each other in a single vertical hole VH, and the gate insulating layer 160 disposed outside the plurality of channel layers 110.

The channel layer 110 may be electrically connected to the substrate 101 via an epitaxial layer 111 in a lower portion thereof. The channel layer 110 may include a semiconductor material, e.g., polysilicon or single-crystal silicon, and the semiconductor material may be a material undoped with an impurity or may include a P-type or N-type impurity. The epitaxial layer 111 may be a layer grown using a selective epitaxy growth (SEG) process. The epitaxial layer 111 may be formed to have a form recessed into the substrate 101 by a predetermined depth, as illustrated in FIG. 4.

The plurality of gate electrode layers 130 may be stacked alternately with the plurality of insulating layers 140 in the Z-axis direction. The plurality of gate electrode layers 130 may be respectively disposed adjacently to at least one channel layer 110, and may be provided as gate electrodes of a ground select transistor GST, a plurality of memory cells MC1 to MCn, and a string select transistor SST. In an example embodiment, a gate electrode layer for a dummy device may be further disposed between the ground select transistor GST and a first memory cell MC1 and between the string select transistor SST and an nth memory cell MCn.

The plurality of gate electrode layers 130 configuring word lines may be extended. In an example embodiment, the plurality of gate electrode layers 130 may be extended together with the plurality of insulating layers 140, to have different lengths, in a first direction, e.g., the X-axis in FIG. 4, such that a step structure used as a pad region may be formed in a portion on the substrate 101. In the pad region, the plurality of gate electrode layers 130 may respectively be connected to a contact plug.

For example, when the plurality of gate electrode layers 130 are formed to have a step structure for the pad region, dummy vertical structures may be disposed adjacently to end portions of the plurality of gate electrode layers 130 to provide structural support, thereby preventing or substantially minimizing bending or breakage of the gate electrode layers 130. For example, the dummy vertical structures may have a structure similar to that of the vertical structures VS. In another example, the dummy vertical structures may have a cylindrical shape, e.g., the channel layer 110 and the gate insulating layer 160 may be provided in a concentric circle shape around a circular embedded insulating layer 115. For example, when the dummy vertical structures and the vertical structures VS are formed to have different shapes, photomask processes for the formation of dummy vertical holes and the vertical holes VH may be performed separately.

The plurality of dummy vertical structures may be electrically isolated from the bit lines BL, as opposed to the vertical structures VS. Thus, writing operations may not be performed in memory cells MC1 to MCn provided by the plurality of dummy vertical structures.

The plurality of gate electrode layers 130 may include a polysilicon or metal silicide material, and the plurality of insulating layers 140 may include an insulating material, e.g., silicon oxide, silicon nitride, and the like. The metal silicide material may be a silicide material of, e.g., cobalt (Co), nickel (Ni), hafnium (Hf), platinum (Pt), tungsten (W) and titanium (Ti). According to an example embodiment, the plurality of gate electrode layers 130 may include a metal, e.g., tungsten (W). In addition, although not illustrated in the drawing, the plurality of gate electrode layers 130 may further include a barrier layer for diffusion prevention, and the barrier layer may include at least one of, e.g., tungsten nitride (WN), tantalum nitride (TaN), and titanium nitride (TiN).

The plurality of gate electrode layers 130, together with the channel layer 110 and the gate insulating layer 160, may provide, e.g., define, the memory cells MC1 to MCn, ground select transistors GST, and string select transistors SST. As described above, the gate insulating layer 160 may include the tunneling layer 162, the charge storage layer 164, and the blocking layer 166 sequentially disposed between the channel layer and the plurality of gate electrode layers 130.

The tunneling layer 162 may allow for tunneling of a charge to be transmitted to the charge storage layer 164 via an F-N tunneling method. The tunneling layer 162 may include, e.g., silicon oxide. The charge storage layer 164 may be a charge trap layer or a floating gate conductive layer. For example, the charge storage layer 164 may include a dielectric material, quantum dots, or nanocrystals. In this case, the quantum dots or nanocrystals may be configured of a conductor, e.g., a metal or semiconductor microparticles. The blocking layer 166 may include a high-K dielectric material. The high-K dielectric material may be a dielectric material having a higher dielectric constant than that of silicon oxide.

For example, when a writing operation is performed in the memory device 100, a charge moving through the tunneling layer 162 may be trapped by the charge storage layer 164. Memory cells MC1-MCn including a charge storage layer 164, by which a charge has been trapped, may have a threshold voltage different from that of memory cells MC1-MCn including a charge storage layer 164 by which a charge has not been trapped. The memory device 100 may detect whether or not a charge has been trapped, from a threshold voltage of each memory cell MC1-MCn, in performing a reading operation, thereby determining whether or not data has been written.

A source region 103 may be formed in the substrate 101. The source region 103 may be formed by injecting an N-type impurity into a portion of the substrate 101, and may extend in a first direction, e.g., in the X-axis direction in FIG. 4. The common source line 150 and the side spacer 109 may be disposed on the source region 103. The side spacer 109 may be provided outside the common source line 150 and may allow a gate structure to be divided into a plurality of regions.

The common source line 150 may be formed to be perpendicular to an upper surface of the substrate 101 and may extend in the first direction. The common source line 150 may be connected to the source region 103, below the plurality of gate electrode layers 130. The source region 103 may be a region formed by injecting an impurity, e.g., an N-type impurity, into a portion of the substrate 101.

Figure 5:
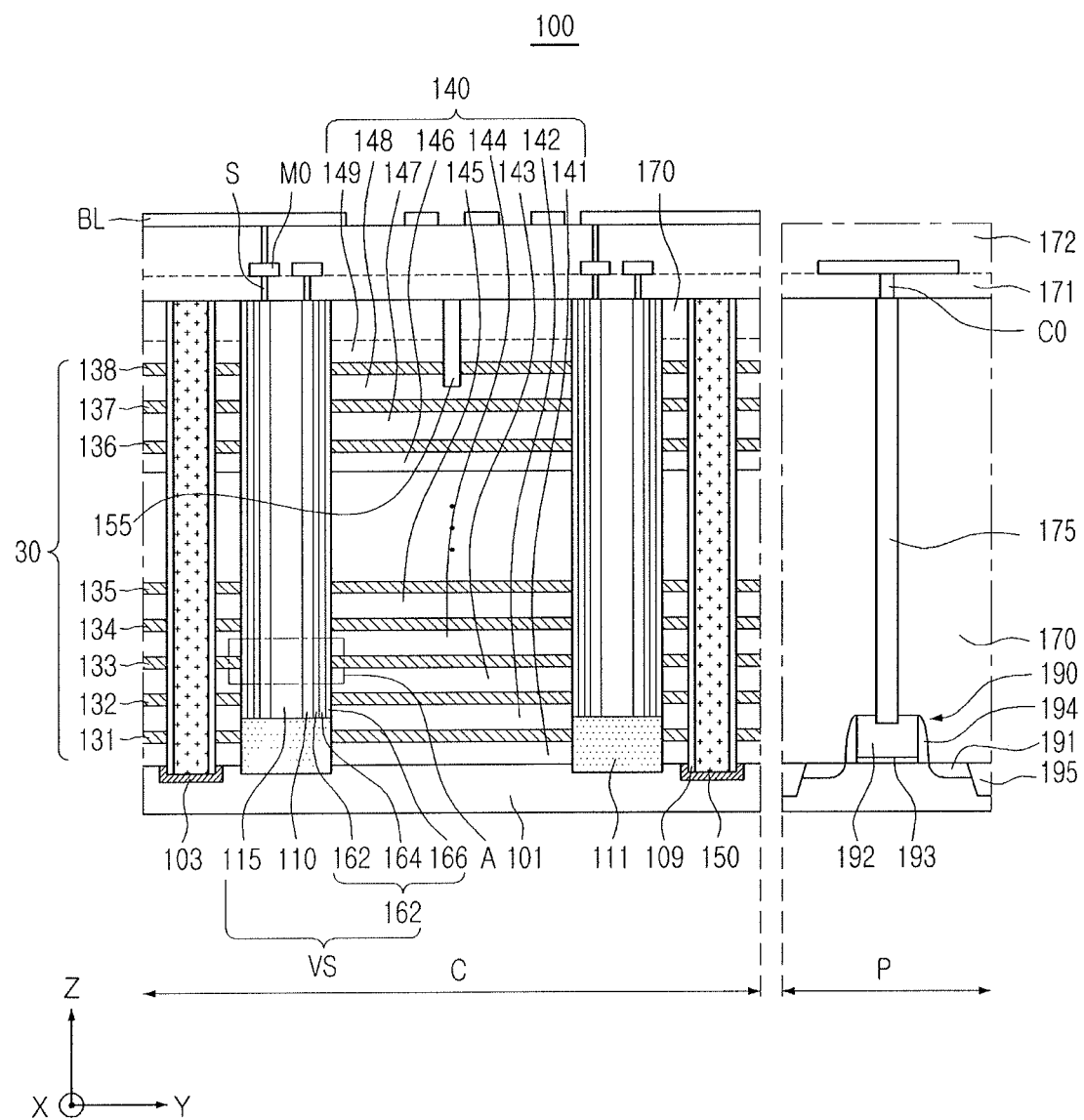
FIG. 5 illustrates a cross-sectional view of a memory device along line S-S' of FIG. 3A.

FIG. 5 is a cross-sectional view of the memory device 100 along line S-S' of FIG. 3A. Hereinafter, the memory device 100 will be described with reference to FIGS. 4-5.

With reference to FIG. 5, the memory device 100 according to an example embodiment may include a cell region C and a peripheral circuit region P. The peripheral circuit region P may be a region defined as a periphery of the cell region C, and may be a region in which a plurality of peripheral circuit elements 190 are disposed.

A plurality of the peripheral circuit elements 190 may be circuit devices transferring a signal required to write or erase data to or from the memory cells MC1 to MCn, and to read data written thereto, and may include a planar transistor. With reference to FIG. 5, the peripheral circuit element 190 may include an active region 191, a planar gate electrode 192, a planar gate insulating layer 193, and the like. A planar spacer 194 may be provided on a side of the planar gate electrode 192, and the active region 191 may be formed to be adjacent to an element isolation film 195. The planar gate electrode 192 and the active region 191 may be connected to at least one peripheral contact 175.

The peripheral contact 175 may extend in a direction perpendicular to an upper surface of the substrate 101, while penetrating an interlayer insulating layer 170. The interlayer insulating layer 175, through which the peripheral contact 175 penetrates, may be formed in the cell region C and the peripheral circuit region P, and may include an insulating material, e.g., silicon oxide, silicon nitride, and the like. The peripheral contact 175 may be connected to a wiring line MO disposed within upper insulating layers 171 and 172, via a wiring contact CO.

The cell region C may include a plurality of the vertical structures VS, a plurality of the gate electrode layers 130, the source region 103, the common source line 150 disposed on the source region 103, the isolation insulating layer 155, and the like. The isolation insulating layer 155 may allow the gate electrode layer 138 provided as a gate electrode of a string select transistor SST, to be divided into a plurality of regions. The interlayer insulating layer 170 may be disposed above a gate structure including the plurality of gate electrode layers 130 and the plurality of insulating layers 140. The interlayer insulating layer 170 may be disposed in the cell region C and the peripheral region P. The upper insulating layers (171 and 172) may be disposed on the interlayer insulating layer 170, and may include a first upper insulating layer 171 and a second upper insulating layer 172.

Each of the plurality of vertical structures VS may include a plurality of the channel layers 110, the embedded insulating layer 115, the epitaxial layer 111, and the like. The plurality of vertical structures VS may extend from an upper surface of the substrate 101 to an upper surface of the interlayer insulating layer 170. The plurality of channel layers 110 may be directly connected to a stud S, to be connected to at least one of a plurality of wiring lines MO via the stud S. In an example embodiment, the plurality of respective channel layers 110 may be formed to have a form protruding from the embedded insulating layer 115, by which the plurality of channel layers 110 may have a sufficient area. Thus, since the stud S may be directly connected to the plurality of respective channel layers 110, a process for the formation of a drain region for allowing a connection between the channel layer 110 and the stud S according to the related art may be omitted.

The plurality of wiring lines MO formed in the cell region C may be respectively and electrically connected to the plurality of bit lines BL provided thereabove. The plurality of bit lines BL may be connected to the wiring lines MO, to electrically connect two channel layers 110 opposing each other, based on the isolation insulating layer 155, between two common source lines 150, to each other, or to electrically connect two channel layers 110 opposing each other, based on the common source line 150, between two isolation insulating layers 155, to each other.

Figure 6:
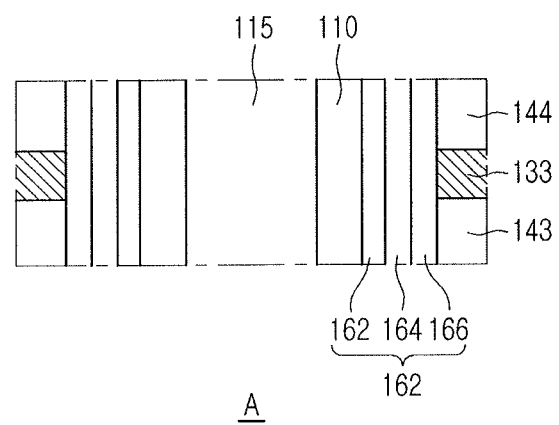
FIG. 6 illustrates an enlarged view of region A of the memory device illustrated in FIG. 5.

FIG. 6 is an enlarged view of region A of the memory device illustrated in FIG. 5.

Referring to FIG. 6, the gate electrode layer 133 with the insulating layers 143 and 144 are illustrated adjacent to the gate insulating layer 160, the embedded insulating layer 115, and the channel layer 110 included in the vertical structure VS. The gate insulating layer 160 may have a structure in which the tunneling layer 162, the charge storage layer 164, and the blocking layer 166 are sequentially stacked from the channel layer 110 to the gate electrode layer 133. Relative thicknesses of the layers configuring the gate insulating layer 160 are not limited to those illustrated in the drawing, and may be variously modified.

The tunneling layer 162 may include at least one of, e.g., silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

The charge storage layer 164 may be a charge trap layer or a floating gate conductive layer. For example, when the charge storage layer 164 is a floating gate, the charge storage layer 164 may be formed by depositing polysilicon using low pressure chemical vapor deposition (LPCVD). For example, when the charge storage layer 164 is a charge trap layer, the charge storage layer 164 may include at least one of silicon oxide($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride ($AlGa_xN_y$).

The blocking layer 166, the charge storage layer 164, and the tunneling layer 162 are illustrated as being disposed on an outer circumferential surface of the channel layer 110, but are not limited thereto. The blocking layer 166 may include, e.g., silicon oxide ($SiO_2$), silicon nitride ($Si_3N_4$), silicon oxynitride (SiON), or a high-k dielectric material. The high-k dielectric material may be any of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

Although FIG. 6 illustrates that the blocking layer 166 includes one layer, in a manner different therefrom, the blocking layer 166 may also include a high dielectric-constant layer and a low dielectric-constant layer having different dielectric constants. In this case, the low dielectric-constant layer may be disposed to be in contact with the charge storage layer 164. The high dielectric-constant layer may be formed of a material having a relatively high dielectric constant as compared to that of the tunneling layer 162, and the low dielectric-constant layer may be formed of a material having a relatively low dielectric constant as compared to that of the high dielectric-constant layer. As the low dielectric-constant layer is disposed on a side of the high dielectric-constant layer, nonvolatile memory device characteristics, e.g., erase characteristics, may be improved by controlling an energy band having a level equal to a barrier level.

FIGS. 7 to 24 are drawings illustrating stages in a method of manufacturing the memory device 100. FIGS. 7, 9, 11, 13, 15, 17, 19, 21, and 23 illustrate plan views of a portion of the memory device 100, and FIGS. 8, 10, 12, 14, 16, 18, 20, 22, and 24 illustrate respective cross-sectional views along line I-I'.

Figure 7:
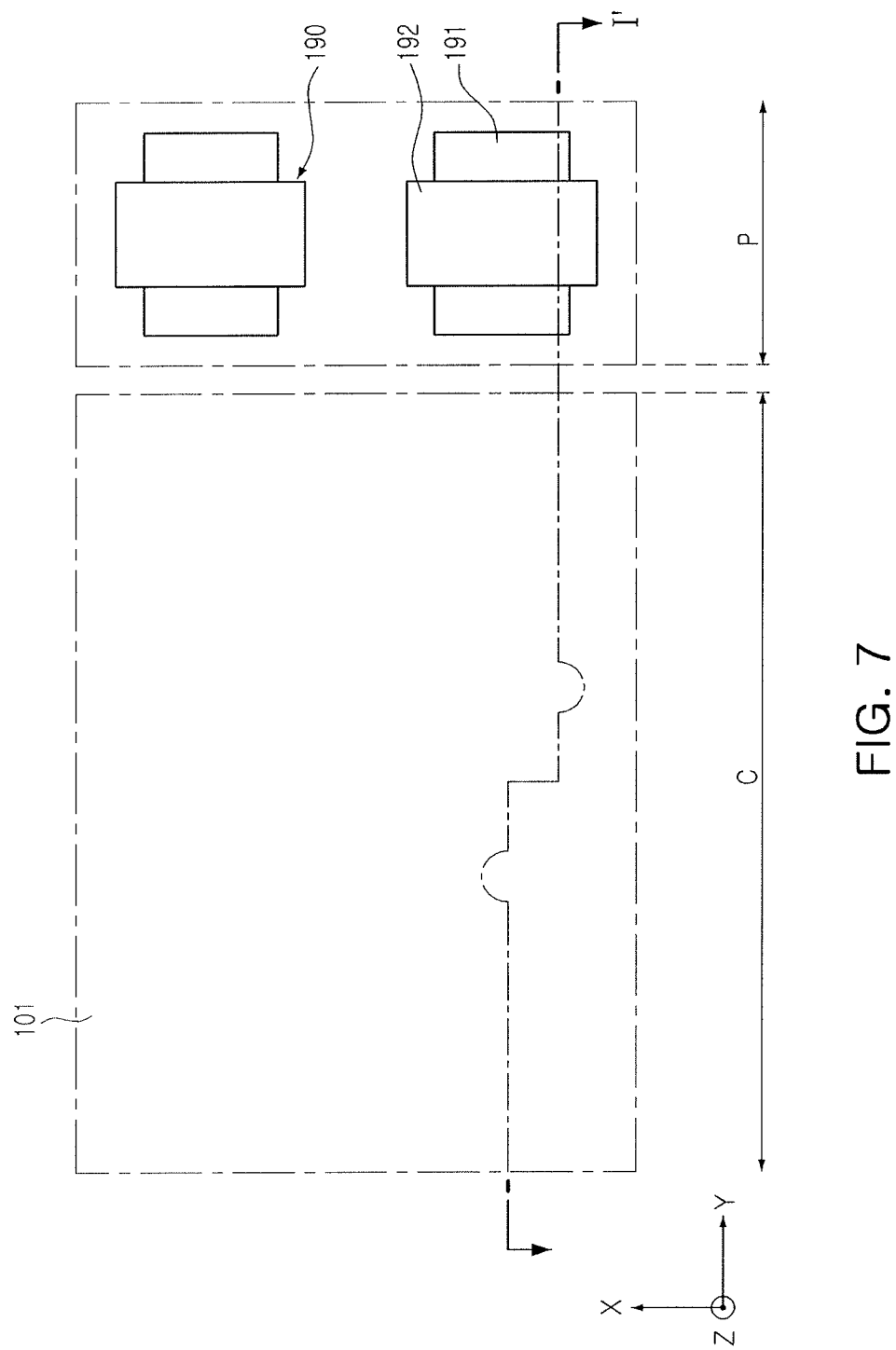
FIGS. 7 to 24 illustrate views of stages in a method of manufacturing a memory device according to an example embodiment.
Figure 8:
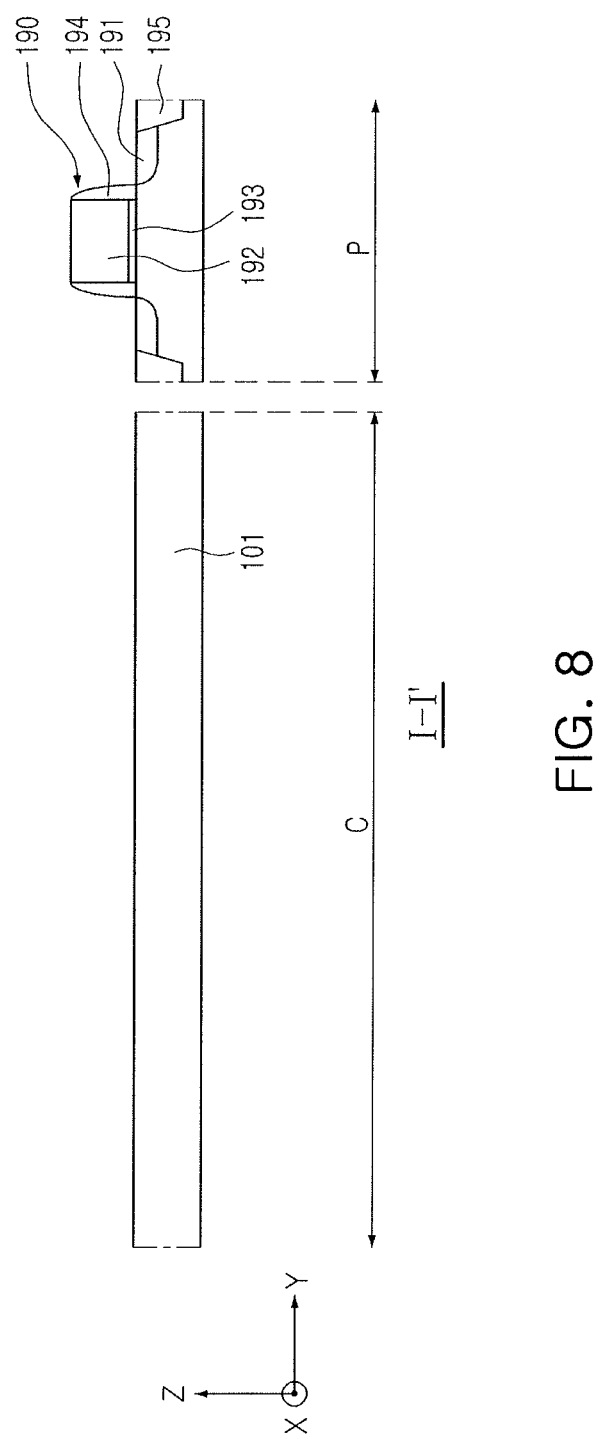

Referring to FIGS. 7 and 8, the cell region C and the peripheral circuit region P may be defined on the substrate 101, and the plurality of peripheral circuit elements 190 may be formed in the peripheral circuit region P. The peripheral circuit element 190 may include the active region 191 and the planar gate electrode 192. The planar gate insulating layer 193 may be disposed between the planar gate electrode 192 and the substrate 101. The planar spacer 194 may be provided on a side of the planar gate electrode 192, and the active region 191 may be formed in a remaining region except for a region of the element isolation film 195.

The substrate 101 may be a single crystal or polycrystalline silicon substrate, and may include at least one well region doped with a first conductivity-type impurity. The plurality of peripheral circuit elements 190 may be disposed on the well region, and the well region located in a lower portion of the cell region C may be a region doped with a P-type impurity.

Figure 9:
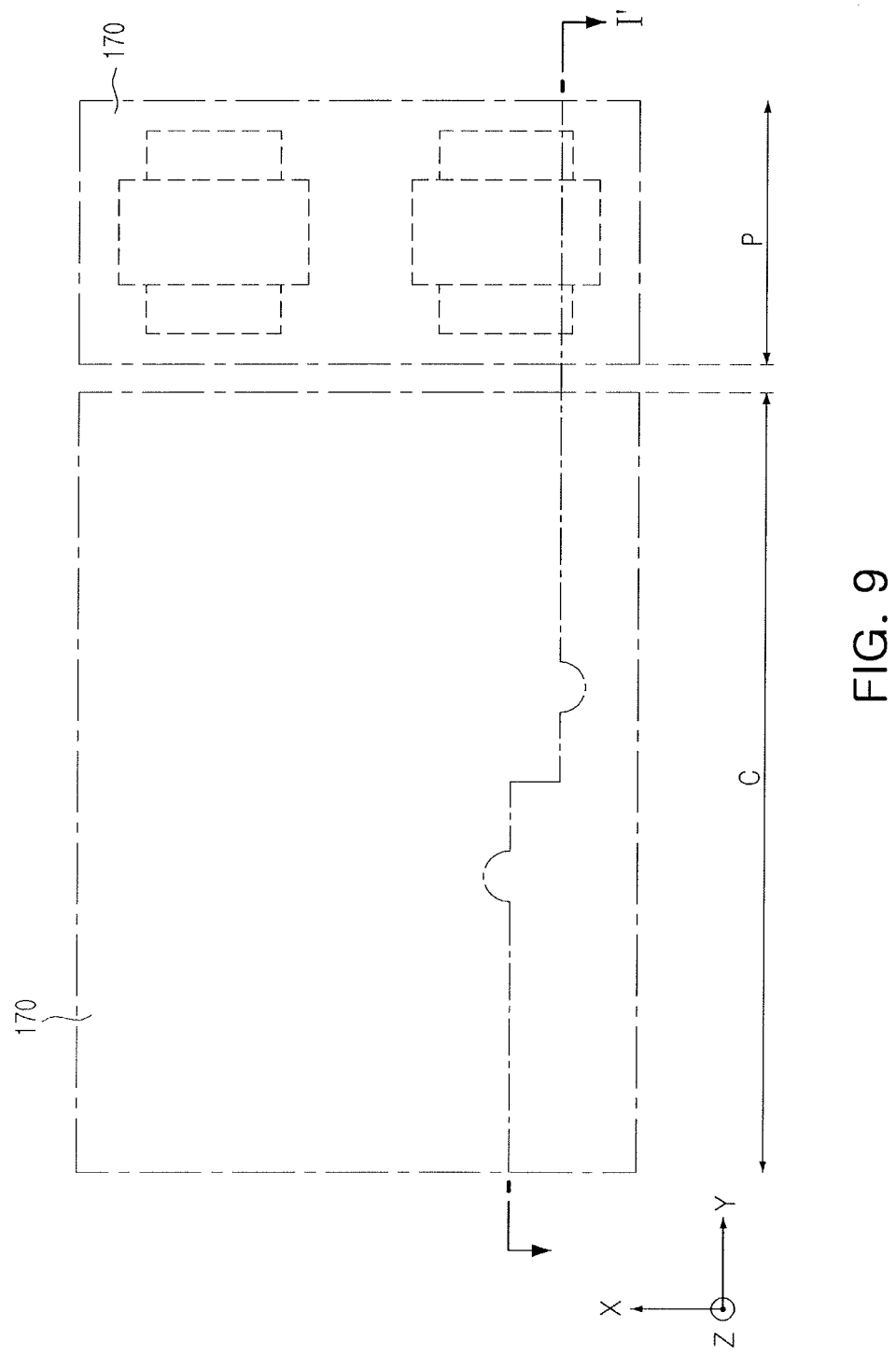
Figure 10:
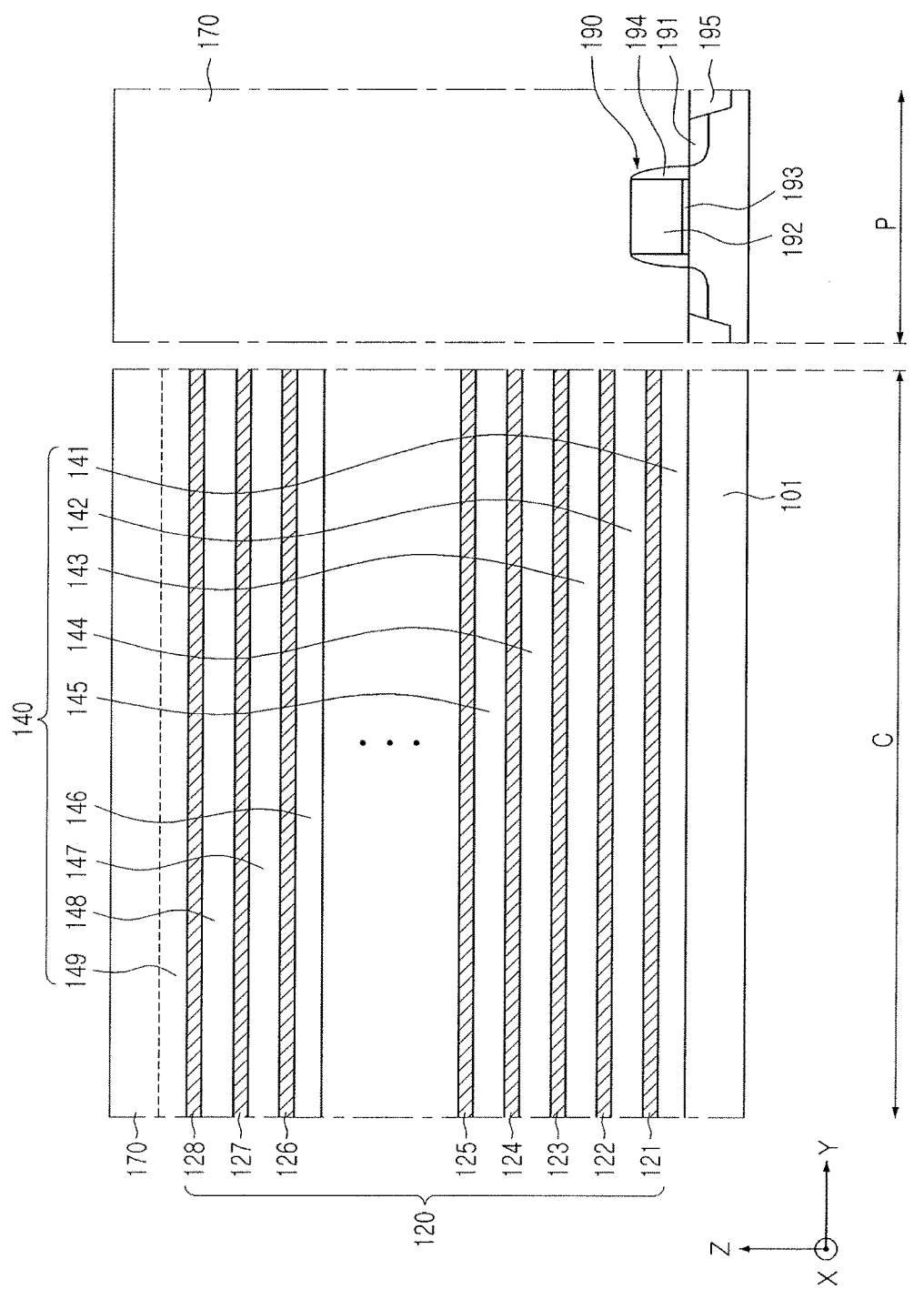

Referring to FIGS. 9 and 10, a plurality of sacrificial layers 121 to 128 (sacrificial layers 120), a plurality of insulating layers 141 to 149 (insulating layers 140), and an interlayer insulating layer 170 may be formed on the substrate 101. The plurality of sacrificial layers 120 and insulating layers 140 may be formed in the cell region C and the peripheral circuit region P, and may then be removed from a region other than the cell region C. The interlayer insulating layer 170 may be formed in the peripheral circuit region P and the cell region C, and may be formed on the plurality of sacrificial layers 120 and insulating layers 140 in the cell region C.

The plurality of sacrificial layers 120 may include a material having a predetermined etch selectivity different from that of the plurality of insulating layers 140. In an example embodiment, for example, when the plurality of insulating layers 140 are formed of silicon oxide, the plurality of sacrificial layers 120 may be formed of silicon nitride. Thus, in a subsequent process, only the plurality of sacrificial layers 120 may be removed while allowing the plurality of insulating layers 140 to remain. The number and thicknesses of the plurality of sacrificial layers 120 and insulating layers 140 may be variously changed according to example embodiments. In the example embodiment illustrated in FIG. 10, although the plurality of sacrificial layers 120 and insulating layers 140 are illustrated as having substantially the same thickness, a portion of the sacrificial layers 120 or a portion of the insulating layers 140 may have different thicknesses.

The interlayer insulating layer 170 may include an insulating material, e.g., silicon oxide and the like, and may include a high density plasma (HDP) oxide layer, a Tetra-Ethyl-Ortho-Silicate (TEOS) oxide layer, or the like. The interlayer insulating layer 170 may also be formed in several operations according to a manufacturing process. In an example embodiment, a lower interlayer insulating layer 170 directly covering the plurality of peripheral circuit elements 190 may be formed of an HDP oxide layer having excellent gap filling characteristics, and an upper interlayer insulating layer 170 may include a TEOS oxide layer of which a deposition speed is relatively fast.

Figure 11:
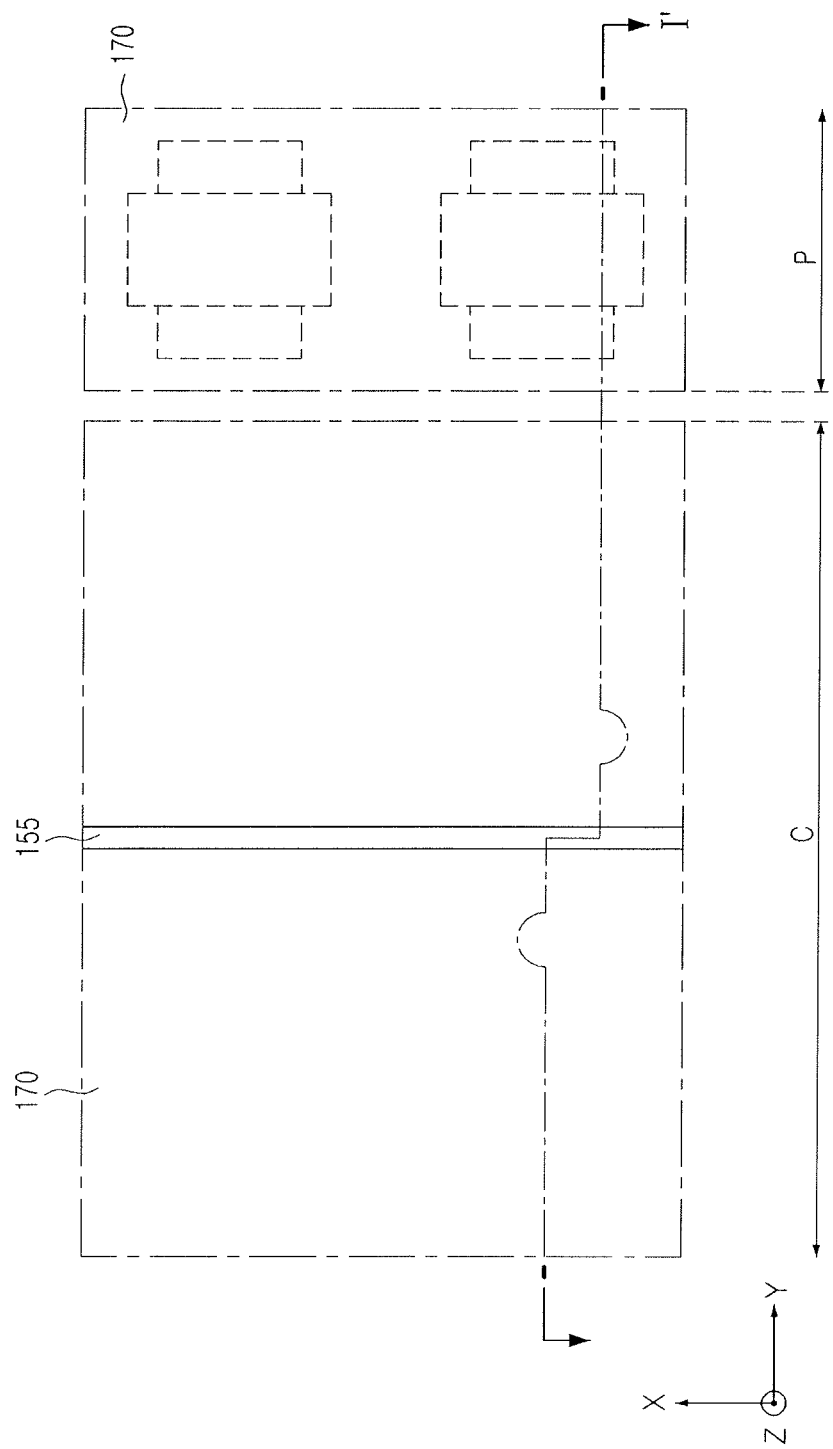
Figure 12:
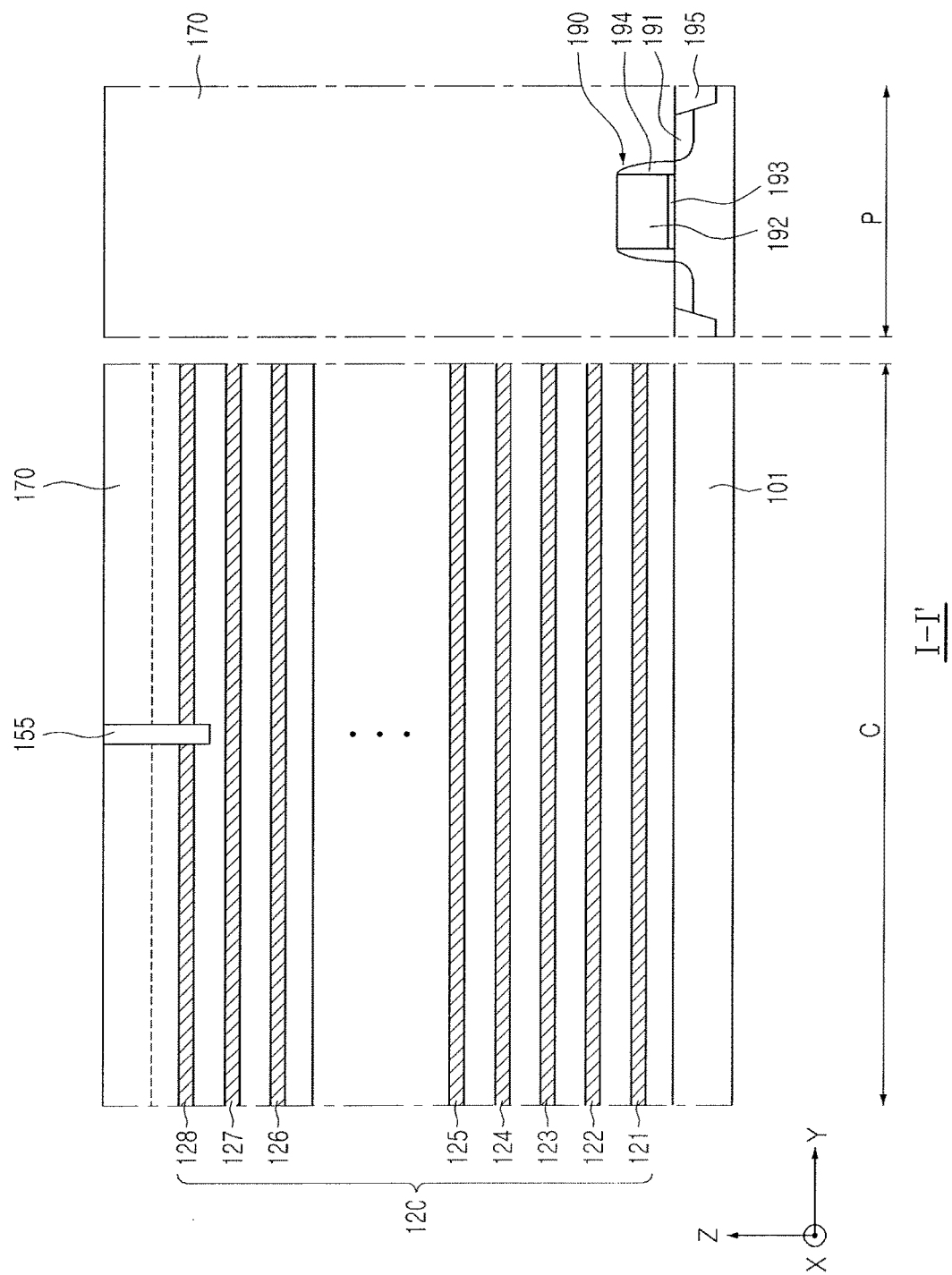

Referring to FIGS. 11 and 12, the isolation insulating layer 155 may be formed from an upper surface of the interlayer insulating layer 170. The isolation insulating layer 155 may include an insulating material, e.g., silicon oxide and the like, in a manner similar to those of the interlayer insulating layer 170 or the plurality of insulating layers 140. In an example embodiment, the isolation insulating layer 155 may include a material having a predetermined etch selectivity different from that of the plurality of sacrificial layers 120.

The isolation insulating layer 155 may allow at least one sacrificial layer 128 to be divided into a plurality of regions. The sacrificial layer 128 divided by the isolation insulating layer 155 may be a layer replaced with a gate electrode layer of a string select transistor SST in a subsequent process.

Figure 13:
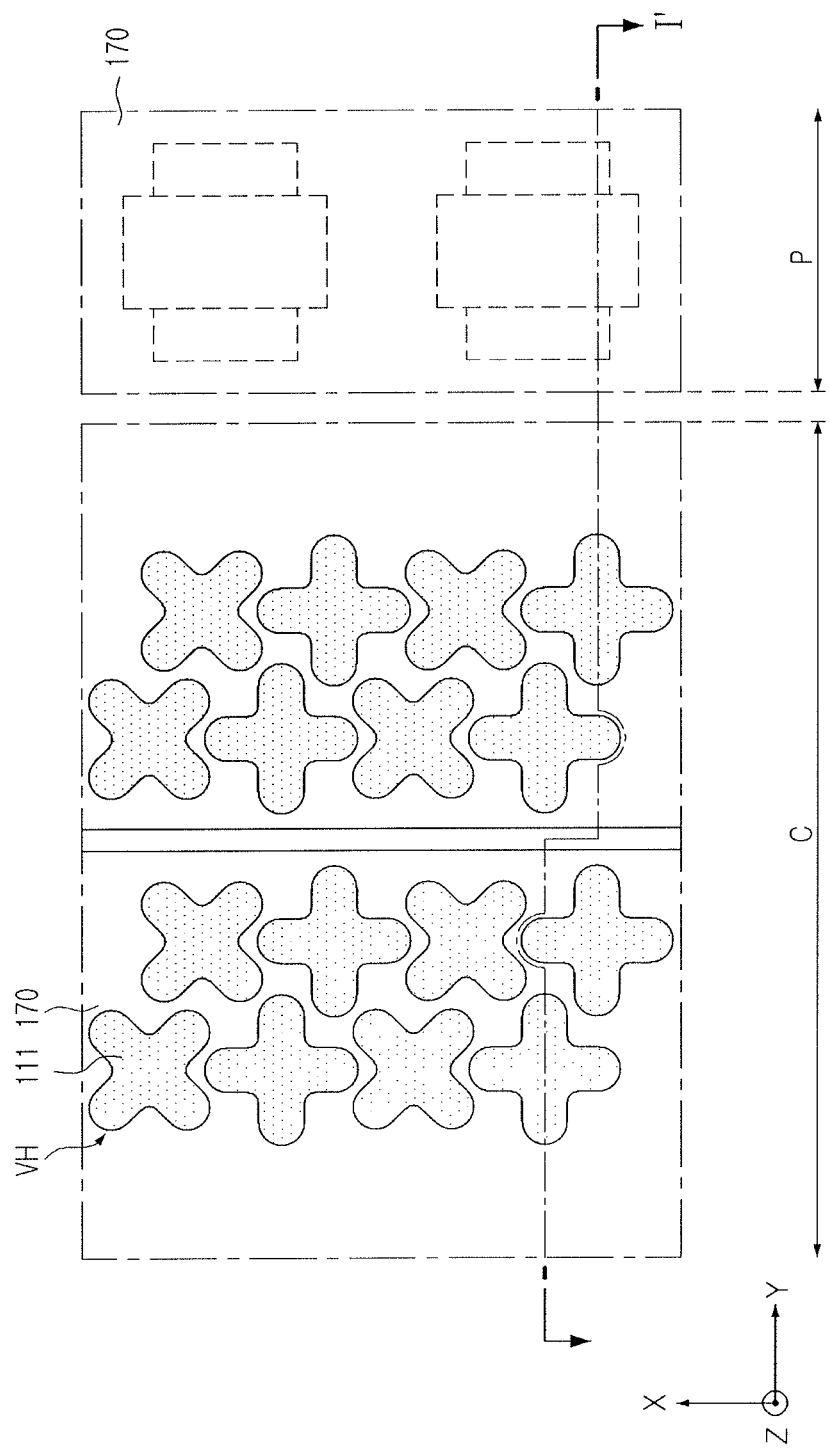
Figure 14:
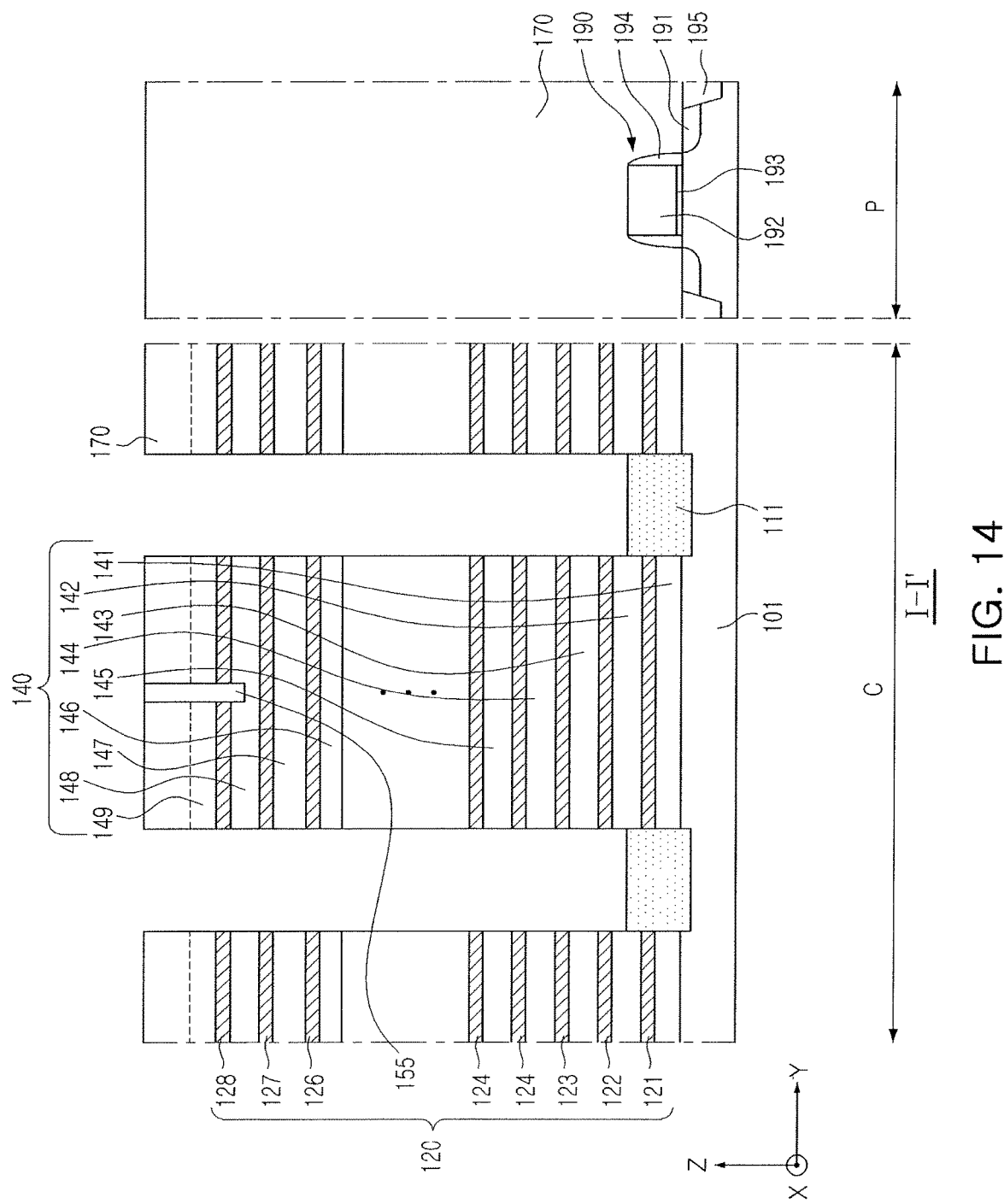

Referring to FIGS. 13 and 14, the plurality of vertical holes VH may be formed. The plurality of vertical holes VH may penetrate through the plurality of sacrificial layers 120, the plurality of insulating layers 140, and the interlayer insulating layer 170.

The vertical hole VH may be formed in a form recessed into the substrate 101 to a predetermined depth. Thus, a portion of the substrate 101 may be exposed to a lower portion of the vertical hole VH. The epitaxial layer 111 may be formed using a selective epitaxial process in which a portion of the substrate 101 exposed in a lower portion of the vertical hole VH is used as a seed. The plurality of vertical holes VH may include the first region corresponding to the central region thereof and the plurality of second regions protruding from the first region, as described previously with reference to FIG. 3A. End portions of the second regions may have a convex shape.

In an example embodiment, a portion of the plurality of vertical holes VH may be formed to penetrate through the isolation insulating layer 155, and the number and positions of the plurality of vertical holes VH are not limited to those illustrated in FIGS. 13 and 14, and may be variously modified.

Figure 15:
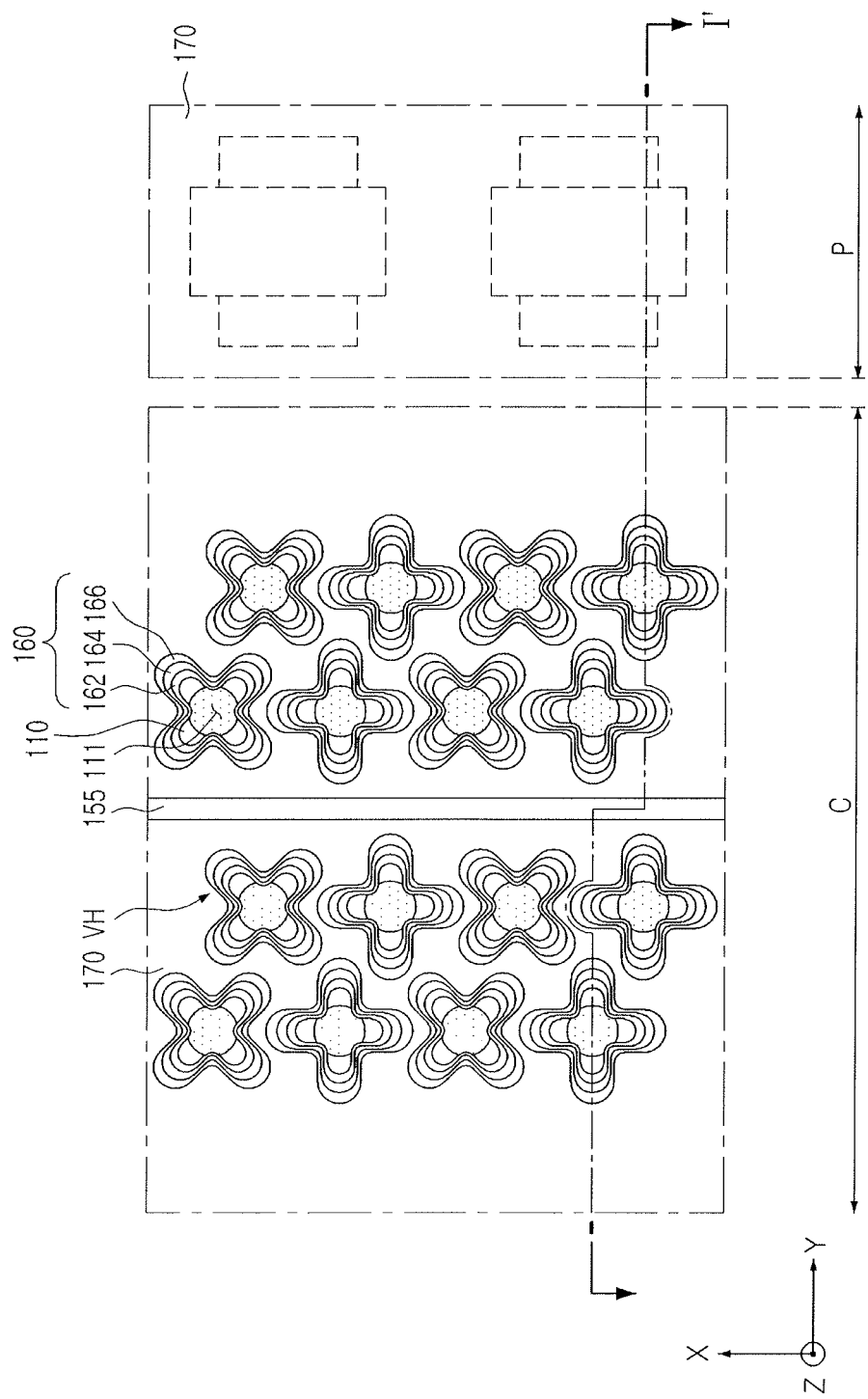
Figure 16:
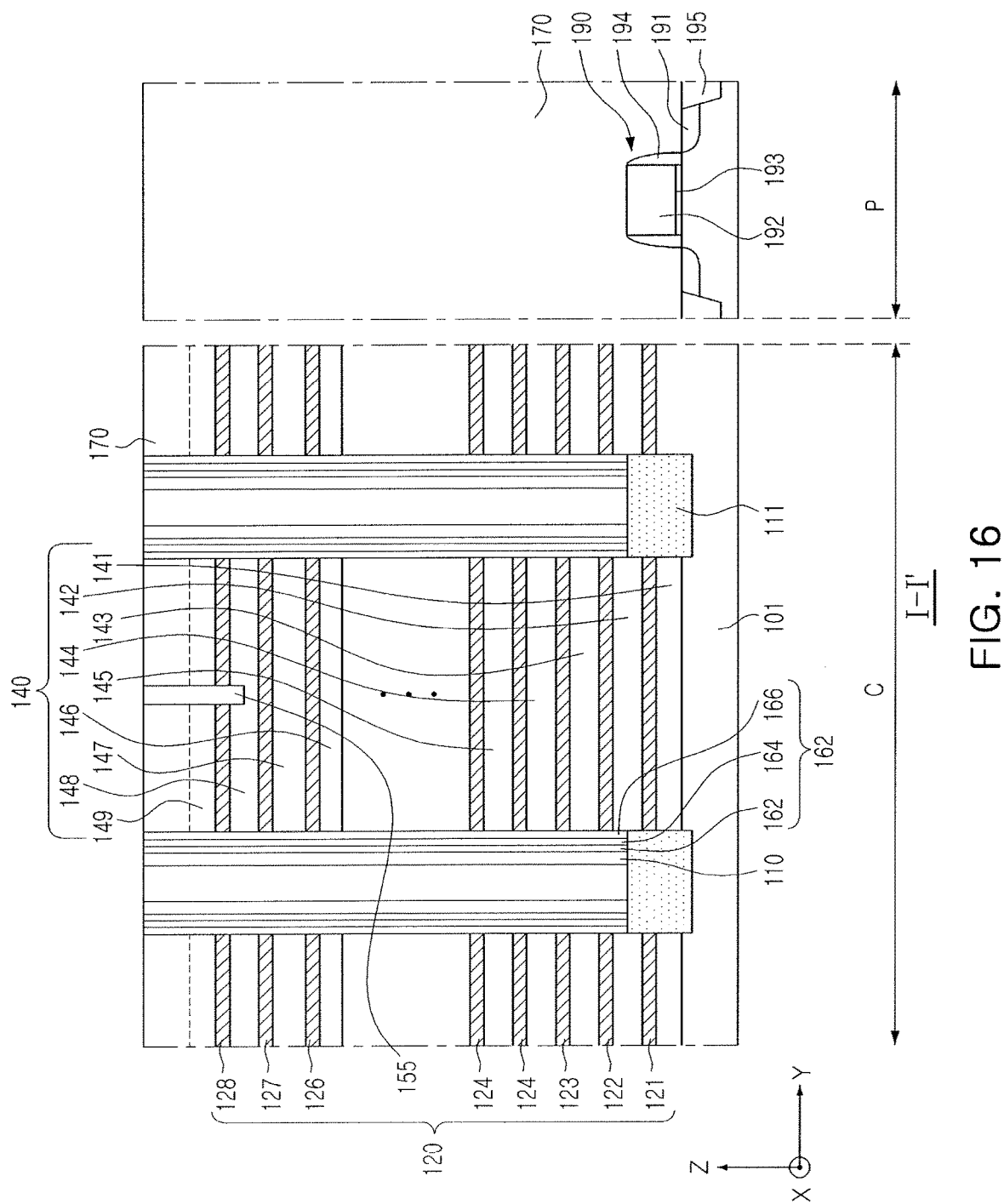

Referring to FIGS. 15 and 16, the blocking layer 166, the charge storage layer 164, the tunneling layer 162, and the channel layer 110 may be sequentially formed in the plurality of vertical holes VH, sequentially externally. The blocking layer 166, the charge storage layer 164, the tunneling layer 162, and the channel layer 110 may be formed in the second regions of the plurality of vertical holes VH. In an example, the blocking layer 166, the charge storage layer 164, and the tunneling layer 162 may be formed in the vertical hole VH using an ALD or CVD process, and the channel layer 110 may be formed on an inner side of the tunneling layer 162. The channel layer 110 may be formed of polysilicon or the like having a predetermined impurity. The blocking layer 166 may include a high-K dielectric material, and may also include two or more layers. In this case, the high-K dielectric material may be a dielectric material having a higher dielectric constant than that of silicon oxide.

Referring to FIG. 15, widths of the blocking layer 166, the charge storage layer 164, the tunneling layer 162, and the channel layer 110 may be relatively reduced in concave regions indented between the plurality of second regions, rather than other regions thereof, due to structural characteristics of the plurality of vertical holes VH. In addition, a width of the channel layer 110 in the concave region indented between the plurality of second regions may be further reduced as compared to other regions, or may be divided into a plurality of regions to be separated from each other.

Figure 17:
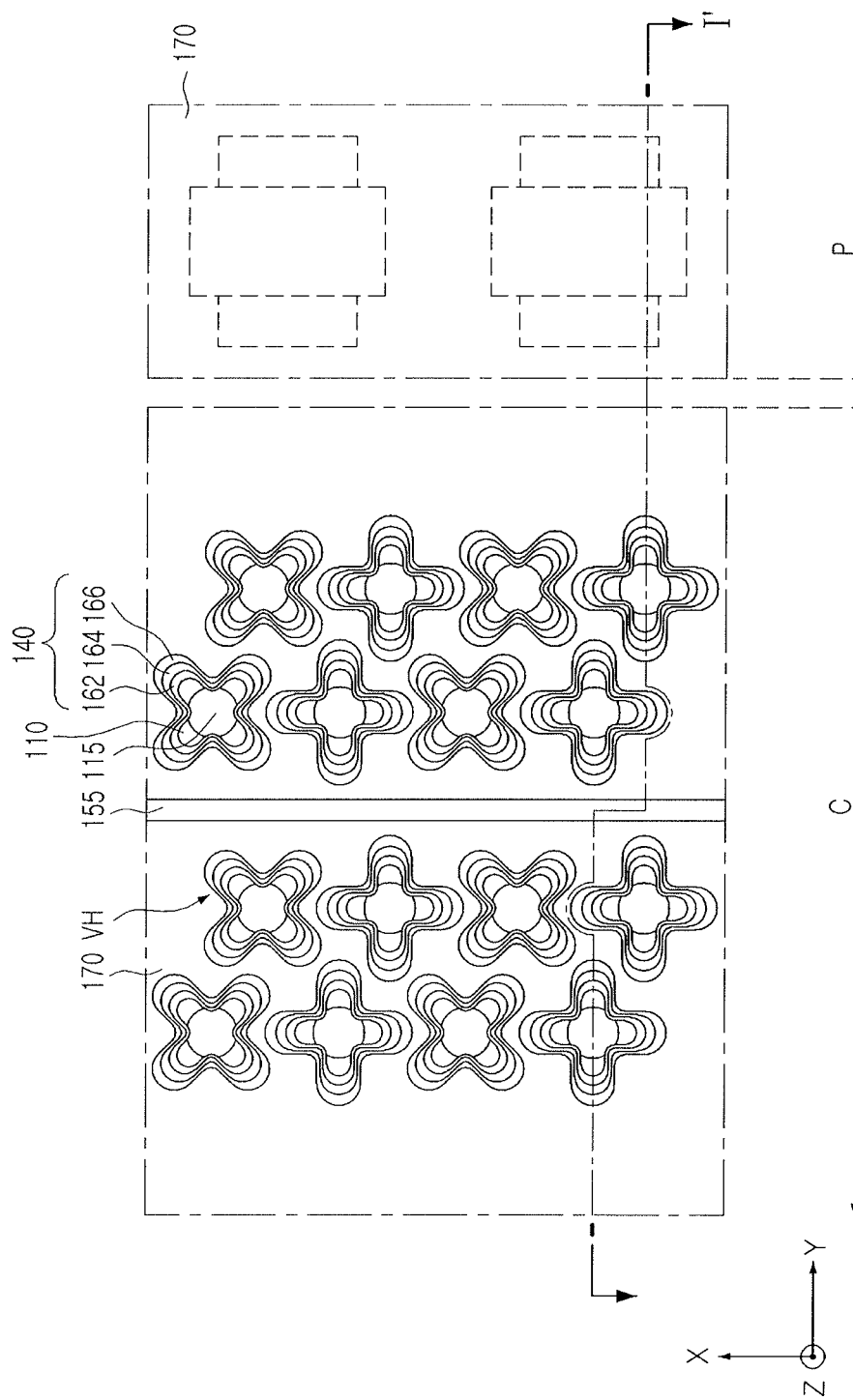
Figure 18:
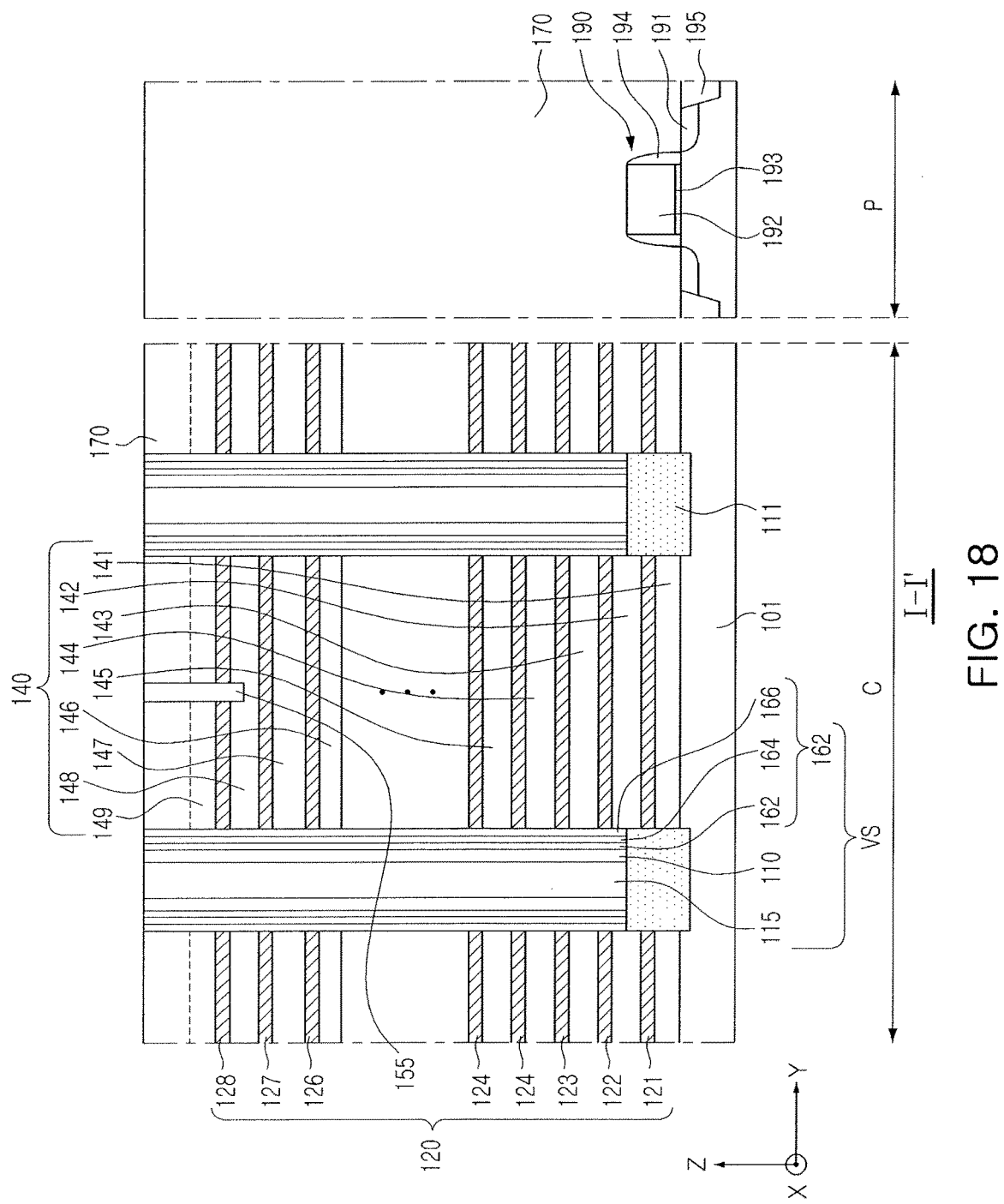

Referring to FIGS. 17 and 18, the embedded insulating layer 115 may be formed on an inner side of the plurality of channel layers 110. Selectively, before forming the embedded insulating layer 115, a hydrogen annealing process in which a structure having the channel layer 110 formed therein is subjected to a heat treatment in a gas atmosphere including hydrogen or heavy hydrogen may further be performed. A majority of crystalline defects present in the channel layer 110 may be prevented by the hydrogen annealing process.

The embedded insulating layer 115 may be formed in the first regions of the vertical holes VH corresponding to central portions of the plurality of vertical holes VH. As described above, a width of the channel layer 110 in the concave region indented between the plurality of second regions may be further reduced as compared to other regions thereof, or may be divided into a plurality of regions to be separated from each other. For example, when a width of the channel layer 110 is significantly reduced, a cut may be formed with a significantly thinned width during a process of forming the embedded insulating layer 115 in the first region, in such a manner that the channel layer 110 may be divided into a plurality of regions.

Figure 19:
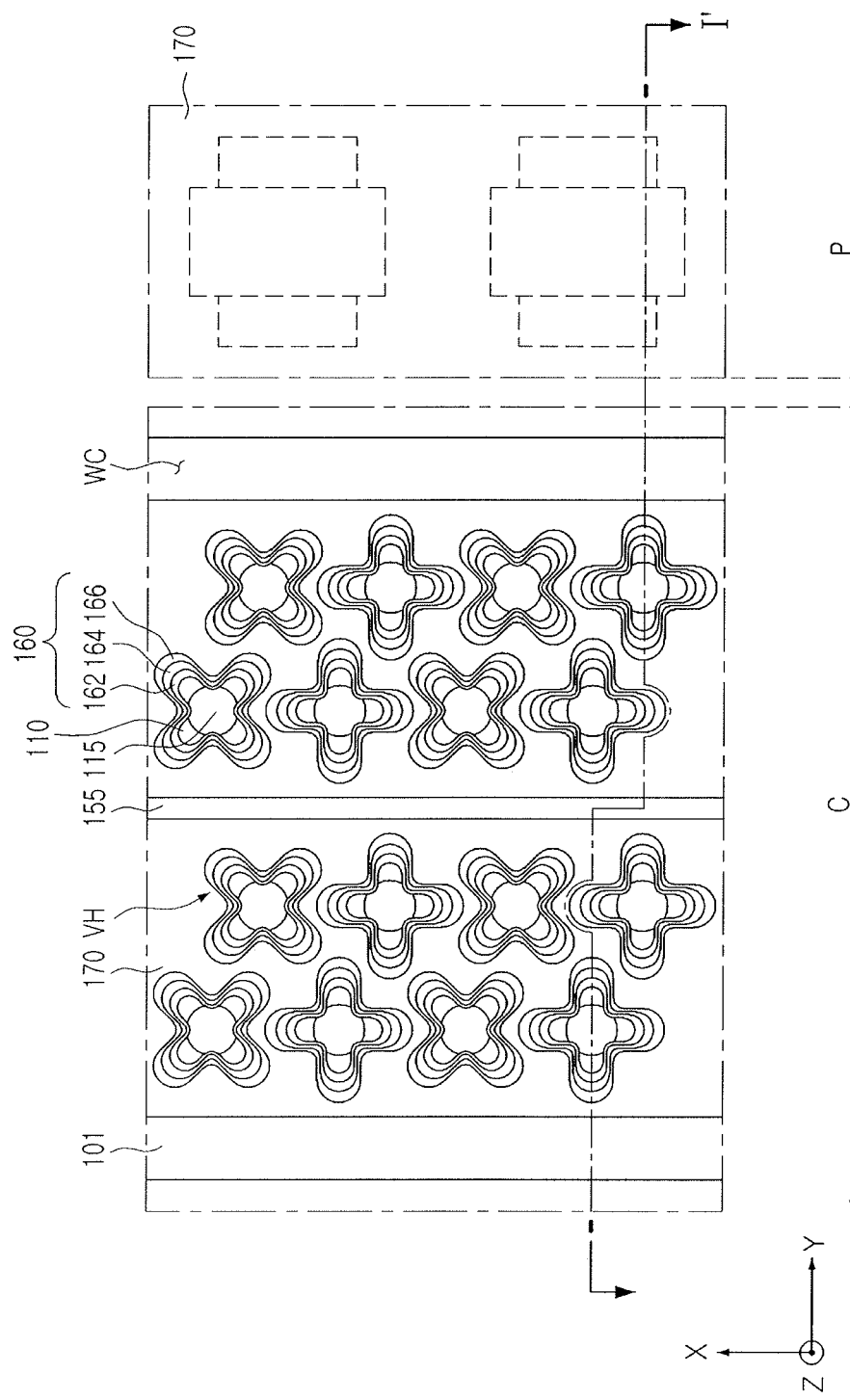
Figure 20:
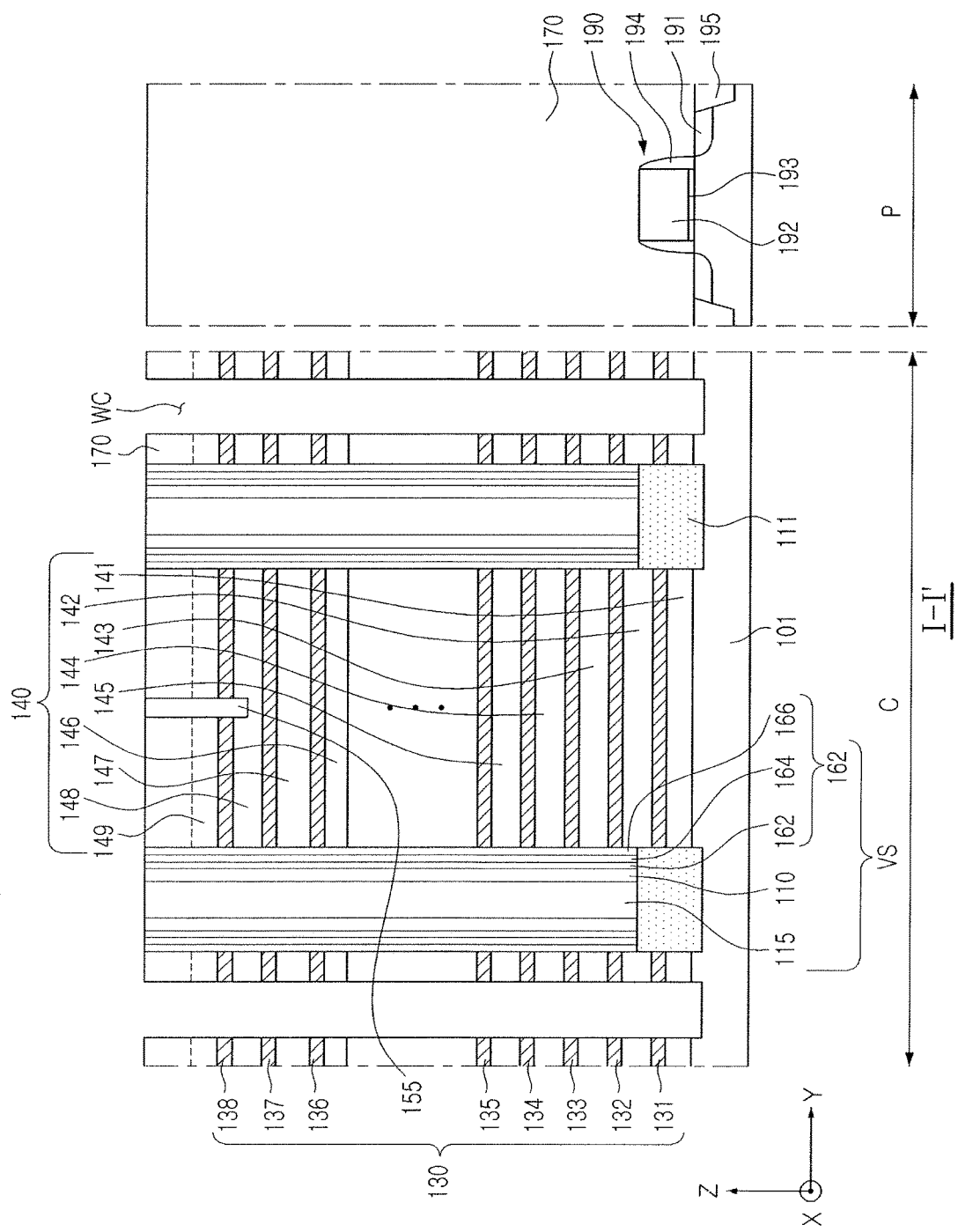

Referring to FIGS. 19 and 20, a word line cut WC dividing the plurality of sacrificial layers 120 and the plurality of insulating layers 140 into a plurality of regions may be formed. The word line cut WC may extend in a first direction (an X axis direction), and a portion of the substrate 101 may be exposed to a lower portion of the word line cut WC.

The plurality of sacrificial layers 120 may be replaced by a plurality of gate electrode layers 131 to 138 (gate electrode layers 130) via the word line cut WC. The plurality of gate electrode layers 130 may form a gate structure together with the plurality of insulating layers 140.

In order to form the plurality of gate electrode layer 130, an etching process of selectively removing only the plurality of sacrificial layers 120 via the word line cut WC may be performed. While the plurality of sacrificial layers 120 are removed, the plurality of insulating layers 140 may remain. The gate electrode layers 130 may be formed in regions from which the plurality of sacrificial layers 120 have been removed.

The gate electrode layers 130 may include, e.g., a metal, polysilicon, or a metal silicide material. The metal silicide material may be a silicide material of, e.g., cobalt (Co), nickel (Ni), hafnium (Hf), platinum (Pt), tungsten (W) and titanium (Ti), or a combination thereof. For example, when the gate electrode layers 130 are formed of a metal silicide material, a silicidizing process may be performed to form a separate metal layer after allowing silicon (Si) to be embedded in side openings, thereby forming the gate electrode layers 130. On the other hand, in an example embodiment, the gate electrode layers 130 may include a plurality of metal layers, for example, a titanium (Ti) layer, a TiN layer, a tungsten (W) layer, and the like.

Figure 21:
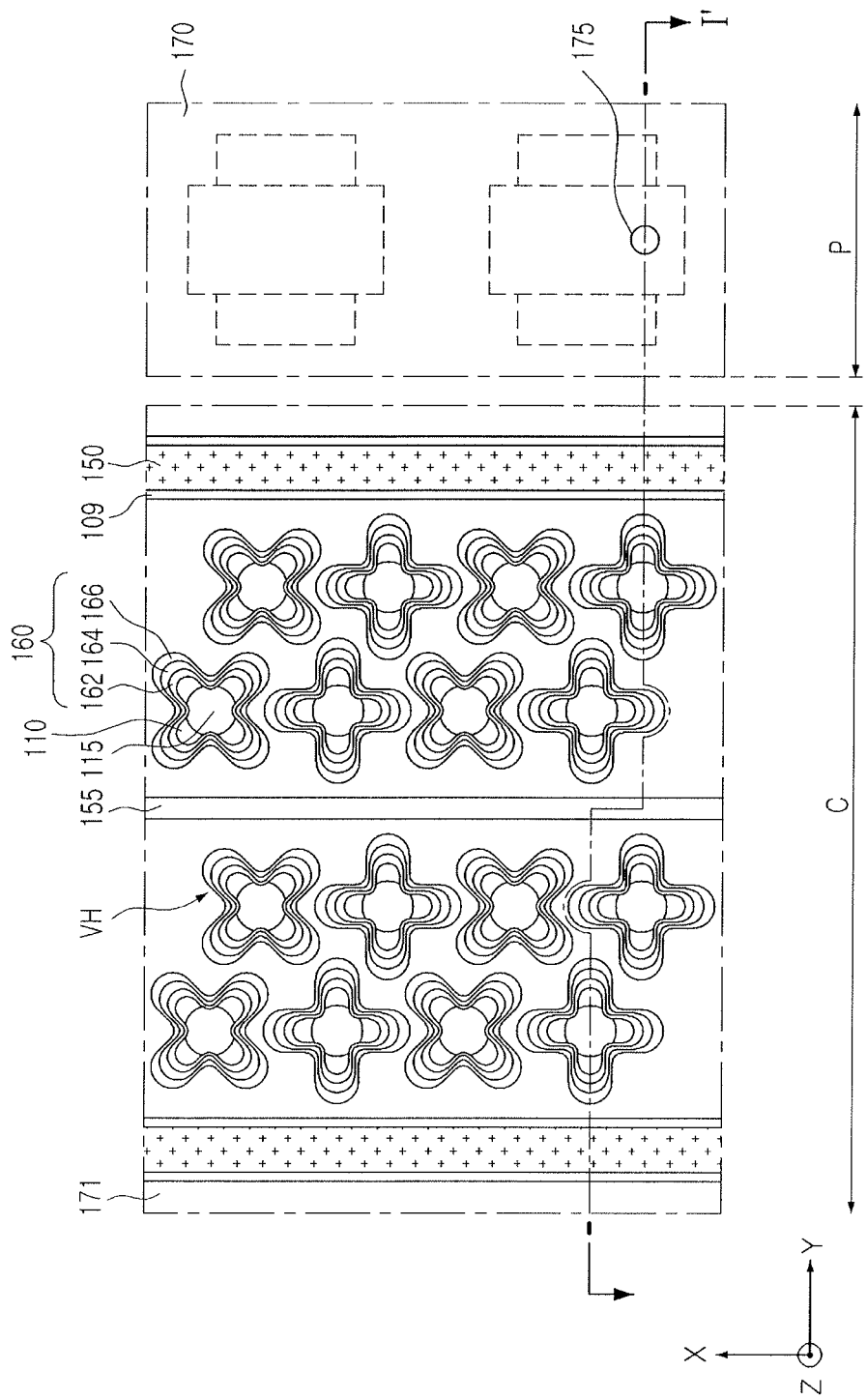
Figure 22:
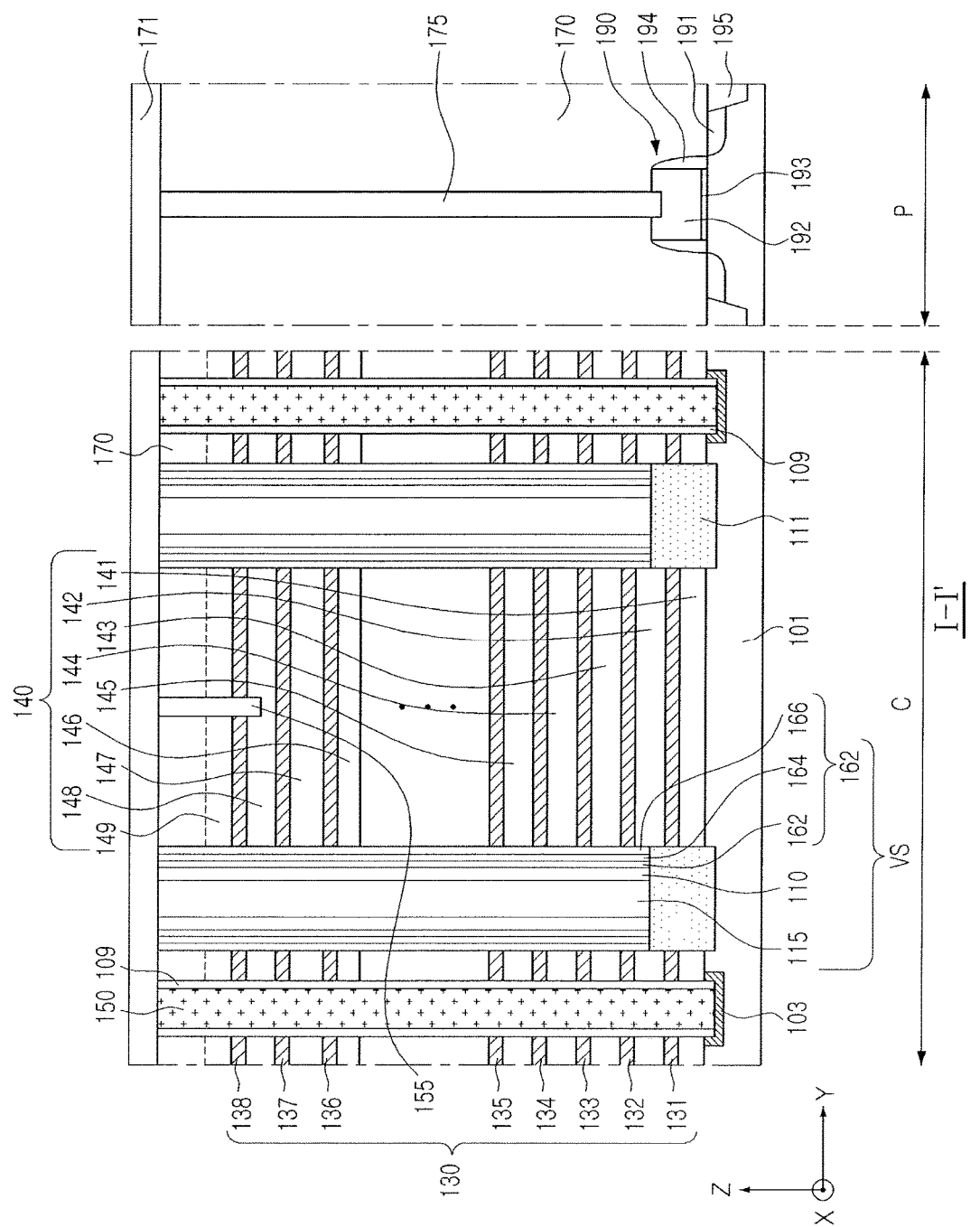

Referring to FIGS. 21 and 22, the side spacer 109 may be formed on an inner side of the word line cut WC, and the source region 103 may be formed by injecting an impurity into a region of the substrate 101, exposed through the word line cut WC. The side spacer 109 may be formed by depositing an insulating material on an internal portion of the word line cut WC and removing the insulating material from a region except for the inner side of the word line cut WC through an anisotropic etching process. The source region 103 may be formed by injecting an impurity using an ion implantation process. In an example embodiment, the source region 103 may include an N-type impurity.

The common source line 150 may be formed in an internal space of the side spacer 109. The common source line 150 may be extended in a direction perpendicular to the upper surface of the substrate 101, e.g., in the Z-axis direction, and in a first direction, e.g., in the X-axis direction, in which the word line cut WC is extended. The common source line 150 may be connected to the source region 103 while being in direct contact therewith, below the plurality of gate insulating layers 140.

In addition, the peripheral contact 175 may be formed to penetrate through the interlayer insulating layer 170, and the upper insulating layer 171 may be formed on an upper surface of the interlayer insulating layer 170. The upper insulating layer 171 may include silicon oxide similarly to the case of the interlayer insulating layer 170, the isolation insulating layer 155, and the like.

Figure 23:
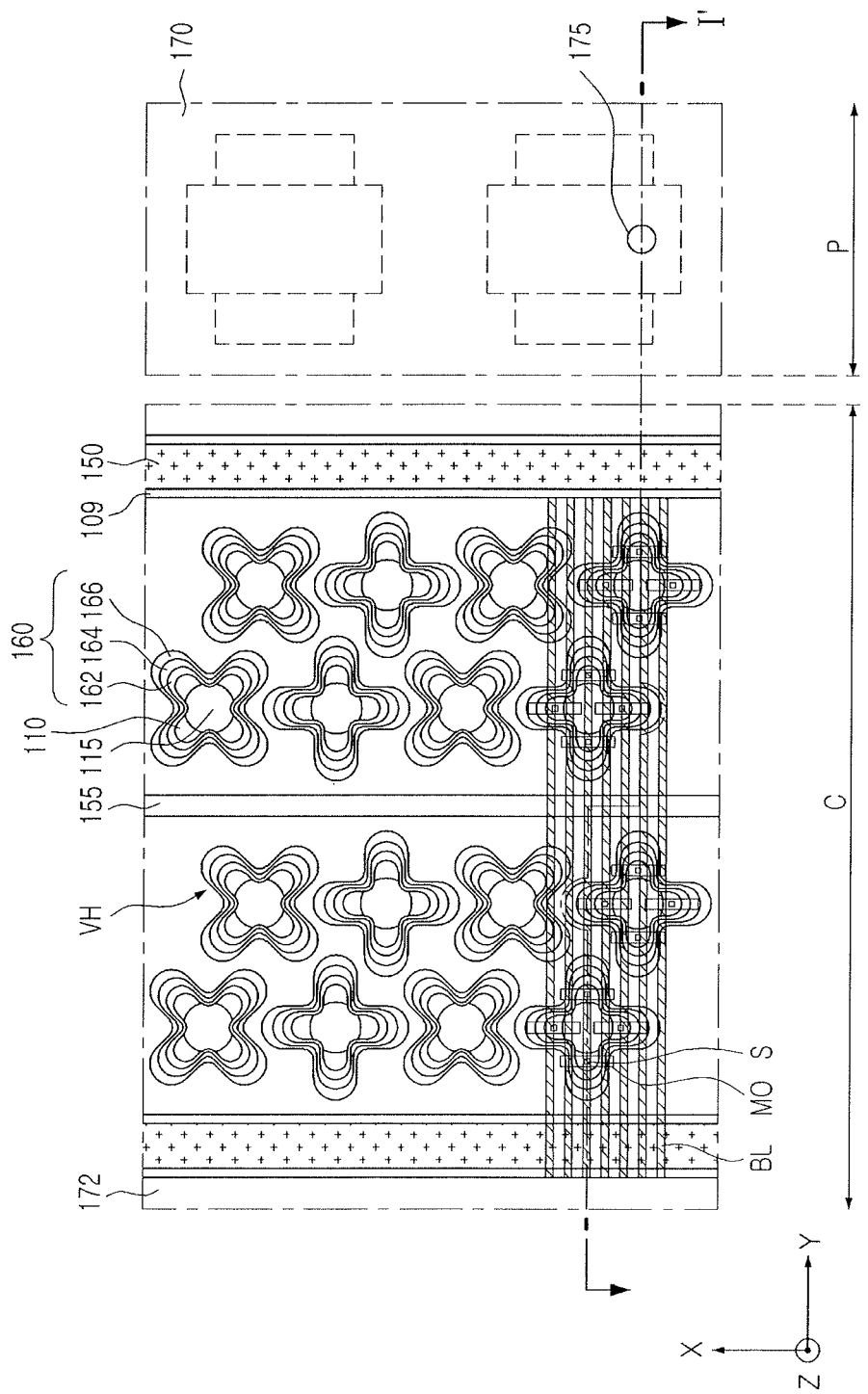
Figure 24:
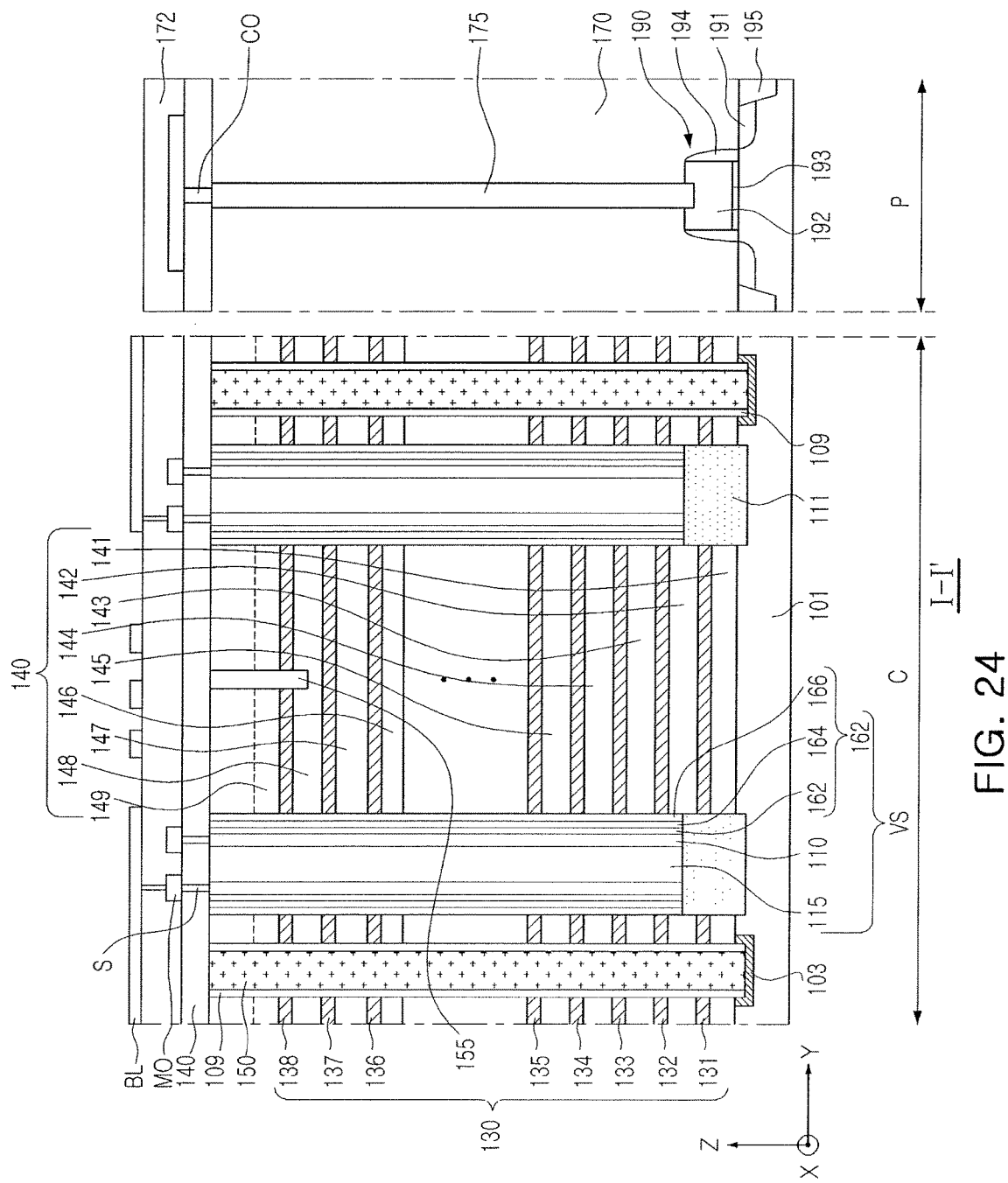

Referring to FIGS. 23 and 24, the stud S penetrating through the upper insulating layer 171 may be formed on the plurality of respective channel layers 110 of the plurality of vertical structures VS, and the wiring contact CO may be formed on the peripheral contact 175. The plurality of wiring lines MO connected to the stud S and the wiring contact CO may be provided on the upper insulating layer 171, and the second upper insulating layer 172 may be formed on the plurality of wiring lines MO and the upper insulating layer 171, e.g., the first upper insulating layer 171. In addition, the bit lines BL may be connected to the plurality of wiring lines MO by penetrating through the second upper insulating layer 172.

The plurality of bit lines BL may be connected to the wiring lines MO, to electrically connect two channel layers 110 opposing each other, based on the isolation insulating layer 155, between two common source lines 150, to each other, or to electrically connect two channel layers 110 opposing each other, based on the common source line 150, between two isolation insulating layers 155, to each other.

Figure 25:
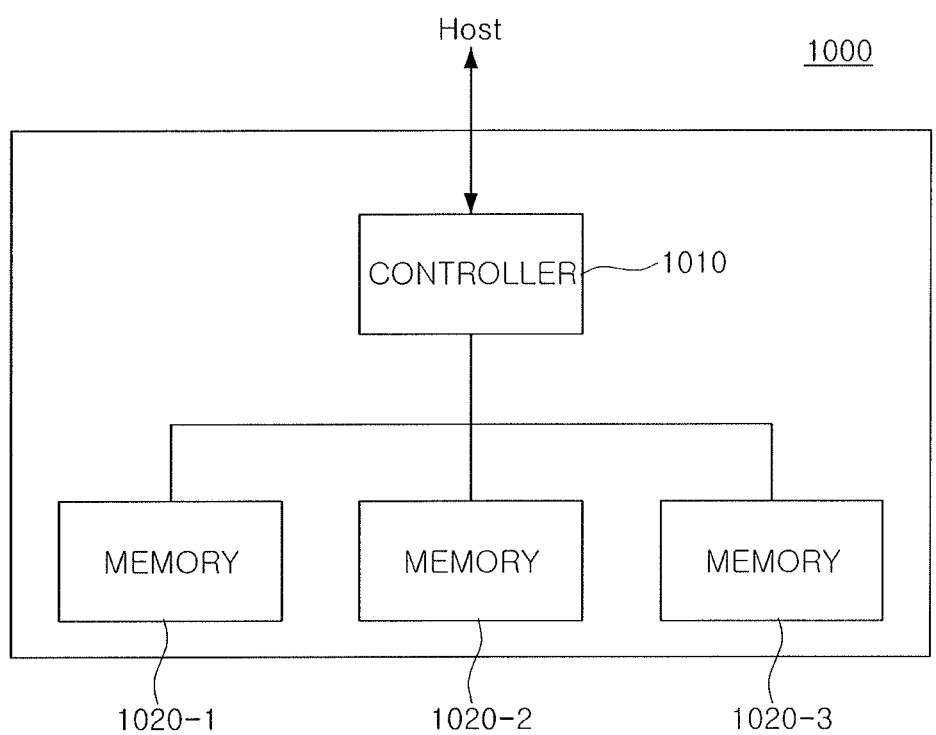
FIG. 25 illustrates a block diagram of an electronic device including a memory device according to an example embodiment.

FIG. 25 is a block diagram of an electronic device including a memory device according to an example embodiment.

With reference to FIG. 25, a storage device 1000 according to an example embodiment may include a controller 1010 communicating with a host and memories 1020-1, 1020-2, and 1020-3 storing data therein. The respective memories 1020-1, 1020-2, and 1020-3 may respectively include a memory device 100, 200, or 300 according to various example embodiments as described above.

The host communicating with the controller 1010 may be provided as various electronic devices in which the storage device 1000 is installed, e.g., a smartphone, a digital camera, a desktop computer, a laptop computer, a portable media player, or the like. The controller 1010 may receive a data writing or data reading request transferred by the host and may generate a command CMD to allow data to be stored in or be read from the memories 1020-1, 1020-2, or 1020-3.

As illustrated in FIG. 25, one or more memories 1020-1, 1020-2, and 1020-3 may be connected to the controller 1010 in parallel within the storage device 1000. The storage device 1000 having a relatively large capacity as in a solid state driver (SSD) may be implemented by connecting the plurality of memories 1020-1, 1020-2, and 1020-3 to the controller 1010 in parallel.

As set forth above, in a memory device according to exemplary embodiments, a plurality of memory cells may be formed using a single vertical hole, thereby improving integration of the memory device while allowing for an increase in a pitch of a channel hole. That is, a channel hole may be formed to have a fan-wing shape, e.g., a single hole having a top view of a flower having multiple petals surrounding a center, with multiple channel layers disposed separately in each of the wing, e.g., petal, shaped regions. Since channel layers are separately disposed in a same channel hole, a plurality of memory cells may be formed in the same channel hole.

Thus, manufacturing efficiency per unit area may be increased, e.g., as compared to manufacturing of a plurality of memory cells using a plurality of channel holes, to improve the integration of a memory device. In addition, a pitch of a channel hole may be significantly increased via improved area efficiency, and the degree of difficulty in an etching process may thus be reduced and manufacturing yield may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
    a gate structure including a plurality of gate electrode layers stacked on an upper surface of a substrate;
    a plurality of vertical holes extending in a direction perpendicular to the upper surface of the substrate to penetrate through the gate structure; and
    a plurality of vertical structures in the plurality of vertical holes, respectively, each vertical structure of the plurality of vertical structures including an embedded insulating layer, and a plurality of channel layers separated from each other, the plurality of channel layers being outside the embedded insulating layer,
    wherein, in a plan view, an angle created by two lines extending from a center of a vertical hole to two adjacent channel layers of this vertical hole is other than straight.

2. The memory device as claimed in claim 1, wherein:
    each of the plurality of vertical holes includes a first region in a central portion and a plurality of second regions protruding from the first region in a plurality of directions, and the embedded insulating layer is in the first region, and the plurality of channel layers are in the plurality of second regions, respectively.

3. The memory device as claimed in claim 2, wherein the plurality of second regions are symmetrical to each other, with respect to the first region.

4. The memory device as claimed in claim 2, wherein the plurality of second regions are provided at least as three regions.

5. The memory device as claimed in claim 2, wherein adjacent channel layers of the plurality of channel layers are separated from each other by a concave portion between the plurality of second regions.

6. The memory device as claimed in claim 5, wherein:
   each of the plurality of vertical structures further comprises a gate insulating layer, the gate insulating layer including a plurality of layers outside the plurality of channel layers, respectively, and
   the concave portion incorporates portions of the plurality of layers of the gate insulating layer.

7. The memory device as claimed in claim 1, wherein at least a portion of the plurality of vertical holes includes a plurality of regions within a same vertical hole protruding in different directions.

8. The memory device as claimed in claim 1, wherein each of the plurality of vertical structures further comprises a gate insulating layer outside the plurality of channel layers.

9. The memory device as claimed in claim 8, wherein the gate insulating layer includes a tunneling layer and a charge storage layer sequentially disposed outside the plurality of channel layers, and the charge storage layer is divided into a plurality of regions.

10. A memory device, comprising:
    a gate structure including a plurality of gate electrode layers stacked on an upper surface of a substrate;
    an interlayer insulating layer on an upper surface of the gate structure;
    a plurality of vertical structures penetrating through the interlayer insulating layer and the gate structure, each of the vertical structures including an embedded insulating layer and a plurality of channel layers outside the embedded insulating layer, the plurality of channel layers including at least three channel layers;
    a plurality of studs connecting to the plurality of channel layers disposed in one of the plurality of vertical structures, respectively, and
    a plurality of bit lines, at least one of the plurality of bit lines being connected to at least one of the plurality of studs.

11. The memory device as claimed in claim 10, wherein the plurality of vertical structures extend from the upper surface of the substrate to an upper surface of the interlayer insulating layer.

12. The memory device as claimed in claim 10, wherein the plurality of studs connected to the plurality of channel layers disposed in one of the plurality of vertical structures, respectively, are connected to different bit lines among the plurality of bit lines.

13. The memory device as claimed in claim 12, further comprising an isolation insulating layer penetrating through the interlayer insulating layer and through at least an uppermost gate electrode layer of the plurality of gate electrode layers to define different portions of the memory device, the plurality of vertical structures penetrating through the interlayer insulating layer in the defined different portions.

14. The memory device as claimed in claim 13, wherein a plurality of channel layers of each of the defined different portions are connected to different bit lines through the plurality of studs.

15. The memory device as claimed in claim 10, wherein the plurality of channel layers within a same vertical structure of the plurality of vertical structures define different memory cells, respectively.

16. A memory device, comprising:
    a gate structure including a plurality of gate electrode layers stacked on an upper surface of a substrate;
    a plurality of vertical holes extending in a direction perpendicular to the upper surface of the substrate to penetrate through the gate structure; and
    a plurality of vertical structures in the plurality of vertical holes, respectively, each vertical structure of the plurality of vertical structures including a plurality of channel layers separated from each other by an embedded insulating layer within a same vertical hole,
    wherein the plurality of channel layers are further separated from each other by a concave portion outside the vertical hole.

17. The memory device as claimed in claim 16, wherein each of the plurality of vertical holes includes a first region surrounded by a plurality of second regions, the embedded insulating layer filling the first region, and the channel layers being in the second regions.

18. The memory device as claimed in claim 17, wherein the plurality of second regions include at least three regions, the embedded insulating layer completely filling the first region and separating between channel layers in the second regions.

19. The memory device as claimed in claim 17, wherein the first region has a substantially circular cross-section in a top view, each second region has a substantially semi-elliptical cross-section in a top view, and the second regions are arranged at equal distances from each other around a circumference of the first region.

20. The memory device as claimed in claim 16, wherein the plurality of channel layers within each vertical hole define different memory cells.

* * * * *